(12) United States Patent  
Yamazaki et al.

(10) Patent No.: US 8,183,102 B2  
(45) Date of Patent: May 22, 2012

(54) SEMICONDUCTOR DEVICE AND MANUFACTURING METHOD THEREOF

(75) Inventors: Shunpei Yamazaki, Setagaya (JP); Yoshiyuki Kurokawa, Sagamihara (JP); Daisuke Kawae, Atsugi (JP); Satoshi Kobayashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 446 days.

(21) Appl. No.: 12/243,085

(22) Filed: Oct. 1, 2008

(65) Prior Publication Data

US 2009/0090909 A1   Apr. 9, 2009

(30) Foreign Application Priority Data

Oct. 5, 2007   (JP) ................................. 2007-262603

(51) Int. Cl.  
*H01L 29/04* (2006.01)

(52) U.S. Cl. ......... 438/158; 438/142; 438/149; 438/151

(58) Field of Classification Search .................. 438/158, 438/555, 556, 783, 591, 142, 149, 151  
See application file for complete search history.

(56) References Cited

U.S. PATENT DOCUMENTS

| | | | | |
|---|---|---|---|---|
| 5,173,753 A * | 12/1992 | Wu | ................ | 257/347 |
| 5,521,107 A * | 5/1996 | Yamazaki et al. | ............ | 438/303 |
| 5,834,345 A * | 11/1998 | Shimizu | ........ | 438/158 |
| 6,093,243 A * | 7/2000 | Okada et al. | ..................... | 117/8 |
| 6,338,990 B1 * | 1/2002 | Yanai et al. | ................... | 438/160 |
| 7,205,171 B2 * | 4/2007 | Luo et al. | ........................ | 438/30 |
| 7,375,372 B2 * | 5/2008 | Luo et al. | ........................ | 257/57 |
| 7,541,229 B2 * | 6/2009 | Gan et al. | ...................... | 438/158 |
| 7,777,231 B2 * | 8/2010 | Gan et al. | ......................... | 257/72 |
| 2002/0039816 A1 * | 4/2002 | Watanabe | ..................... | 438/197 |
| 2003/0162337 A1 * | 8/2003 | Zhang et al. | ................ | 438/166 |
| 2003/0183821 A1 * | 10/2003 | Suzawa et al. | .................. | 257/66 |
| 2004/0266177 A1 * | 12/2004 | Tanaka et al. | ................ | 438/637 |
| 2005/0176187 A1 * | 8/2005 | Luo et al. | ...................... | 438/158 |
| 2005/0176188 A1 * | 8/2005 | Luo et al. | ...................... | 438/158 |
| 2006/0024866 A1 * | 2/2006 | Gan et al. | ...................... | 438/149 |
| 2006/0088999 A1 * | 4/2006 | Sin et al. | ....................... | 438/689 |
| 2006/0197087 A1 * | 9/2006 | Luo et al. | ........................ | 257/59 |
| 2007/0018167 A1 * | 1/2007 | Suzawa et al. | .................. | 257/66 |
| 2007/0096097 A1 * | 5/2007 | Kim et al. | ........................ | 257/59 |
| 2007/0114533 A1 * | 5/2007 | Luo et al. | ........................ | 257/61 |
| 2007/0134856 A1 * | 6/2007 | Jang et al. | ..................... | 438/149 |
| 2009/0085033 A1 * | 4/2009 | Su et al. | ......................... | 257/59 |
| 2010/0327281 A1 * | 12/2010 | Nakajima et al. | .............. | 257/57 |

FOREIGN PATENT DOCUMENTS

| | | |
|---|---|---|
| JP | 58-086776 | 5/1983 |
| JP | 59-172774 | 9/1984 |
| JP | 60-160170 | 8/1985 |
| JP | 63-258072 | 10/1988 |
| JP | 06-104283 | 4/1994 |

* cited by examiner

*Primary Examiner* — Victor A Mandala  
*Assistant Examiner* — William Harriston  
(74) *Attorney, Agent, or Firm* — Eric J. Robinson; Robinson Intellectual Property Law Office, P.C.

(57) ABSTRACT

To improve field effect mobility of an inverted-staggered TFT using amorphous silicon. In an inverted-staggered TFT, a thin amorphous semiconductor layer which is made to have n-type conductivity is formed between a gate insulating film and an amorphous semiconductor layer. By depositing an amorphous semiconductor layer after a substrate over which up to a gate insulating film is formed is exposed to an atmosphere which contains a phosphine gas in a small amount, an amorphous semiconductor layer which contains phosphorus is formed during the early stage of deposition of the amorphous semiconductor layer. The thus obtained amorphous semiconductor layer has the concentration peak of phosphorus around the surface of the gate insulating film.

18 Claims, 27 Drawing Sheets

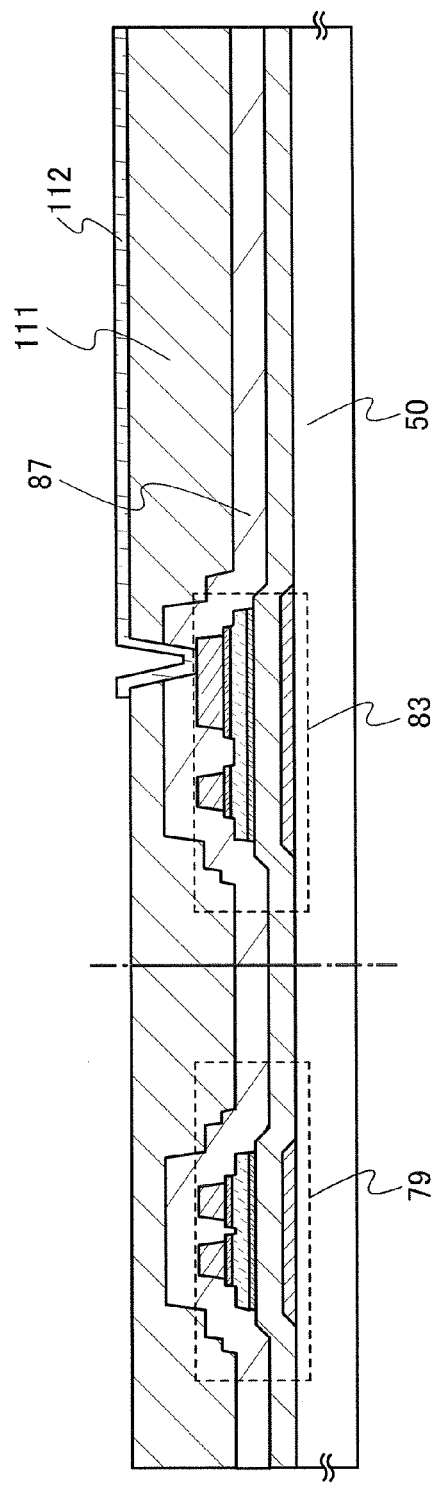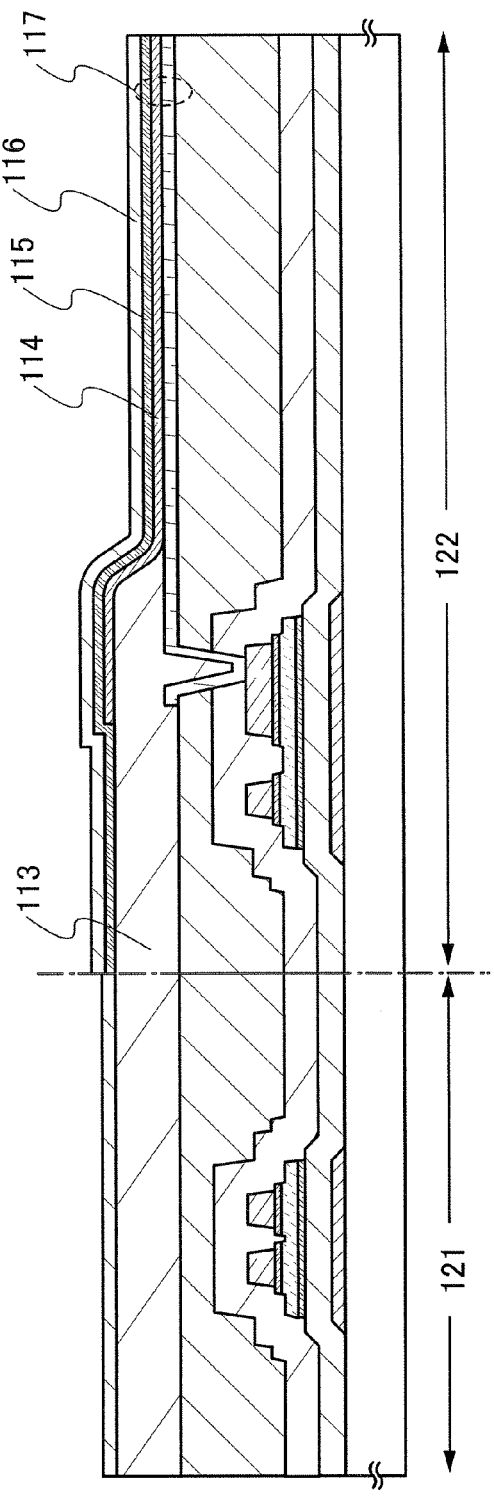

SEMICONDUCTOR DEVICE AND MANUFACTURING METHOD THEREOF

BACKGROUND OF THE INVENTION

1. Field of the Invention

The present invention relates to a semiconductor device which includes a circuit having a thin film transistor (hereinafter referred to as TFT), and a manufacturing method thereof. For example, the present invention relates to an electronic device on which an electro-optical device typified by a liquid crystal display panel is mounted as a component.

Note that in this specification, a semiconductor device refers to all devices that can function by utilizing semiconductor characteristics. An electro-optical device, a semiconductor circuit, and an electronic device are all semiconductor devices.

2. Description of the Related Art

In recent years, a technique for forming a thin film transistor (TFT) by using a semiconductor thin film (with a thickness of approximately several nanometers to several hundred nanometers) formed over a substrate having an insulating surface has attracted attention. Thin film transistors have been widely applied to electronic devices such as ICs and electro-optical devices and have been rapidly developed particularly as switching elements for image display devices.

Liquid crystal display devices are known as image display devices. Active matrix liquid crystal display devices have been often used because higher-definition images can be obtained as compared to passive matrix liquid crystal display devices. In an active matrix liquid crystal display device, when pixel electrodes which are arranged in matrix are driven, a display pattern is formed on a screen. Specifically, when voltage is applied between a selected pixel electrode and a counter electrode corresponding to the pixel electrode, a liquid crystal layer which is provided between the pixel electrode and the counter electrode is optically modulated. This optical modulation is recognized as a display pattern by a viewer.

Silicon is mainly used as a material for an active layer of a TFT. Conventionally, a TFT has been formed using an amorphous silicon film.

In addition, a production technique where one mother glass substrate is cut into separate sections to obtain a plurality of panels so that mass production is efficiently performed has been employed. The size of a mother glass substrate is 300 mm×400 mm for the first generation in the beginning of 1990, which has increased to 680 mm×880 mm or 730 mm×920 mm for the fourth generation in 2000. Production techniques have progressed so that a number of display panels can be obtained from one substrate.

Further, as the substrate size has been increased, demands on improvement in productivity and reduction in cost have been increased.

As a TFT structure which satisfies these demands, an inverted-staggered (bottom-gate) TFT structure has been mainstream.

Reference 1 (Japanese Published Patent Application No. S58-86776) discloses a method for manufacturing a MOS transistor, in which a gate electrode is formed over an insulating substrate; an insulating film is formed over the gate electrode; and when glow discharge or arc discharge decomposition of a silane-based gas, or sputtering of silicon with the use of a gas to which a hydrogen gas is added is performed to selectively form an amorphous silicon layer over the insulating film, step-like discharge is performed in which discharge power of the glow discharge, the arc discharge, or the sputtering is low at the beginning of a discharge period and the discharge power is high in the rest of the discharge period.

SUMMARY OF THE INVENTION

In an active matrix liquid crystal display device, it is necessary that voltage be applied to a liquid crystal layer and electricity be stored in a storage capacitor in a short gate switching period. In particular, in a liquid crystal display device with a larger screen or a high-definition liquid crystal display device, a large amount of drive current is necessary. Therefore, it is necessary that a TFT used as a switching element have high field effect mobility.

When an amorphous silicon layer is used as an active layer of a TFT, field effect mobility is low and drive current cannot be easily increased.

When a polycrystalline silicon layer is used as an active layer of a TFT, field effect mobility can be increased. However, since a crystallization process and the like are added, increase in manufacturing cost due to large increase in the number of processes, and decrease in productivity occur.

In view of the foregoing problems, it is an object of the present invention to provide a TFT which uses an amorphous silicon layer as an active layer of the TFT and has higher field effect mobility than a conventional TFT. It is an object of the present invention to provide a method for manufacturing a microcrystalline semiconductor film, in which the microcrystalline semiconductor film is formed efficiently.

Further, when an amorphous silicon layer is formed using the technique disclosed in Reference 1, in which a film is formed by step-like discharge, deposition time is increased as a deposition rate is decreased. Therefore, much nitrogen, oxygen, or the like is contained in an amorphous silicon layer around an interface of a gate insulating film, so that it is difficult to obtain sufficient film quality.

In the present invention, in an inverted-staggered TFT, by forming a thin amorphous semiconductor layer which is made to have n-type conductivity between a gate insulating film and an amorphous semiconductor layer, the field effect mobility of the TFT is improved.

Alternatively, by making part (preferably less than 50 nm) of the amorphous semiconductor layer around the interface of the gate insulating film have n-type conductivity deliberately, the field effect mobility of the TFT is improved.

As an n-type impurity element used for forming the amorphous semiconductor layer which is made to have n-type conductivity or for making part of the amorphous semiconductor layer have n-type conductivity, phosphorus, arsenic, or antimony can be used. In particular, phosphorus, which is available at low cost as a phosphine ($PH_3$) gas, is preferably used.

Note that although nitrogen and oxygen are also elements which make part of the amorphous semiconductor layer have n-type conductivity, defect density in the amorphous semiconductor layer is increased due to these elements, which becomes a factor for decrease in field effect mobility. Therefore, the concentration of each of these elements in the amorphous semiconductor layer is preferably lower than the concentration of phosphorus. Specifically, the concentration of each of these elements in the amorphous semiconductor layer is lower than or equal to $5\times10^{18}$ $cm^{-3}$. In addition, the concentration of carbon, which increases a defect level and inhibits carrier transfer is preferably lower. The concentration of boron in the amorphous semiconductor layer is lower than or equal to $5\times10^{18}$ $cm^{-3}$. Further, the concentration of boron in the amorphous semiconductor layer is preferably lower than or equal to one-tenth the concentration of phosphorus.

A method for manufacturing a semiconductor device of the present invention, which is disclosed in this specification, includes the following steps: forming a gate electrode over a substrate which has an insulating surface, forming an insulating layer over the gate electrode, exposing the surface of the insulating layer to an atmosphere containing a phosphine gas, forming an n-type amorphous semiconductor layer over the insulating layer, forming an amorphous semiconductor layer which has larger film thickness than the n-type amorphous semiconductor layer over the n-type amorphous semiconductor layer, forming an n-type semiconductor layer which contains phosphorus at higher concentration than the n-type amorphous semiconductor layer over the amorphous semiconductor layer, and forming a source electrode or a drain electrode over the n-type semiconductor layer. The present invention achieves at least one of the above-described objects.

By depositing an amorphous semiconductor layer after a substrate over which up to a gate insulating film is formed is exposed to an atmosphere which contains a phosphine gas in a small amount, an amorphous semiconductor layer which contains phosphorus is formed during the early stage of deposition of the amorphous semiconductor layer. The thus obtained amorphous semiconductor layer has the concentration peak of phosphorus around the surface of the gate insulating film.

Further, by exposing the surface of the gate insulating film to an atmosphere which contains a phosphine gas in a small amount, phosphorus is made to attach to (react with) the surface of the gate insulating film before nitrogen or oxygen is made to attach to (react with) the surface of the gate insulating film so that much nitrogen or oxygen is prevented from being contained in an amorphous silicon layer around the interface of the gate insulating film.

As the atmosphere which contains a phosphine gas in a small amount, an atmosphere of mixture gas of a phosphine gas and an inert gas (e.g., an argon gas), an atmosphere of mixture gas of a silane gas and a phosphine gas, an atmosphere of a mixture gas of a silane gas diluted with hydrogen and a phosphine gas, or the like can be used.

In particular, an atmosphere of mixture gas of both a silane gas and a phosphine gas can effectively reduce nitrogen or oxygen which is to be contained in the amorphous silicon layer around the interface of the gate insulating film.

Further, before the amorphous semiconductor layer is deposited, not only does a silane gas or a phosphine gas flow into a chamber but also plasma may be generated to deposit an amorphous semiconductor film which contains phosphorus on the inner wall of the reaction chamber. By carrying the substrate to deposit the amorphous semiconductor layer after the amorphous semiconductor film which contains phosphorus is deposited on the inner wall of the reaction chamber, phosphorus can be made to be contained during the early stage of the deposition of the amorphous semiconductor layer. Alternatively, by carrying the substrate to deposit the gate insulating film and the amorphous semiconductor layer after the amorphous semiconductor film which contains phosphorus is deposited on the inner wall of the reaction chamber before the gate insulating film is formed, phosphorus can be made to be contained during the early stage of the deposition of the amorphous semiconductor layer.

Alternatively, each flow rate is controlled, and mixture gas where a small amount of phosphine gas is mixed into a silane gas diluted with hydrogen as a source gas is used to generate plasma, so that an amorphous semiconductor layer which is made to have n-type conductivity is deposited; and then, introduction of the small amount of phosphine gas is stopped and subsequently, a silane gas diluted with hydrogen may be used to deposit an amorphous semiconductor layer. In the case of using this method, the concentration of phosphorus in the amorphous semiconductor layer which is made to have n-type conductivity is distributed uniformly or substantially uniformly. Alternatively, a concentration gradient may be formed in the concentration of phosphorus in the amorphous semiconductor layer which is made to have n-type conductivity by gradually changing the flow rate of the phosphine gas so that the vicinity of the gate insulating film has the concentration peak is located around the gate insulating film.

Below the source electrode, the gate electrode, the gate insulating film, the amorphous semiconductor layer which is made to have n-type conductivity, an intrinsic amorphous semiconductor layer (also referred to as an undoped a-Si:H layer), and an n-type semiconductor layer (also referred to as an $n^+$-type a-Si:H layer) are sequentially stacked over the substrate. The n-type semiconductor layer may contain micro crystals. The n-type semiconductor layer is provided between the source electrode and the intrinsic amorphous semiconductor layer in order to obtain a favorable ohmic contact. The n-type semiconductor layer can also be referred to as an $n^+$-type layer because it contains phosphorus at higher concentration than the amorphous semiconductor layer which is made to have n-type conductivity. Further, the amorphous semiconductor layer which is made to have n-type conductivity can also be referred to as an $n^-$-type layer because it contains phosphorus at lower concentration than the $n^+$-type layer.

A structure obtained by the above-described manufacturing method is one aspect of the present invention. The structure is a semiconductor device which includes a gate electrode over a substrate which has an insulating surface, an insulating layer over the gate electrode, an n-type amorphous semiconductor layer over the insulating layer, an amorphous semiconductor layer which has larger film thickness than the n-type amorphous semiconductor layer over the n-type amorphous semiconductor layer, an n-type semiconductor layer which contains phosphorus at higher concentration than the n-type amorphous semiconductor layer over the amorphous semiconductor layer, and a source electrode or a drain electrode over the n-type semiconductor layer. In the n-type amorphous semiconductor layer, the concentration of each of nitrogen and oxygen is lower than ten times the concentration of phosphorus contained in the n-type amorphous semiconductor layer, and the concentration of boron is lower than one-tenth the concentration of phosphorus contained in the n-type amorphous semiconductor layer.

As for specific concentrations in the semiconductor device, the concentration of each of nitrogen and oxygen contained in the n-type amorphous semiconductor layer is lower than or equal to $5\times10^{18}$ cm$^{-3}$, and the concentration of phosphorus is higher than or equal to $6\times10^{15}$ cm$^{-3}$ and lower than or equal to $3\times10^{18}$ cm$^{-3}$. The concentration of phosphorus in the n-type amorphous semiconductor layer is preferably higher than or equal to $3\times10^{16}$ cm$^{-3}$ and lower than or equal to $3\times10^{17}$ cm$^{-3}$. Further, the concentration of carbon in the n-type amorphous semiconductor layer is preferably lower than or equal to $5\times10^{18}$ cm$^{-3}$.

FIG. 6A illustrates a model of a layered structure of an inverted-staggered TFT which has an $n^-$-type layer. As illustrated in FIG. 6A, a gate electrode 12, a gate insulating film 13, an $n^-$-type layer 14, an intrinsic amorphous semiconductor layer 15, a source region 16 which is an $n^+$-type layer, a drain region 17 which is an $n^+$-type layer, a source electrode 18, and a drain electrode 19 are provided over a substrate 11 which has an insulating surface.

In the inverted-staggered TFT which has the n⁻-type layer 14, as for a drain current path 10 in the case where voltage which is sufficiently higher than the threshold voltage is applied to the gate electrode 12 to be turned on, first, a first current path (resistance $R_d$) is formed in a film thickness direction sequentially from the drain electrode 19, the drain region 17 which is an n⁺-type layer, the intrinsic amorphous semiconductor layer 15, and the n⁻-type layer.

Then, since the n⁻-type layer is provided more closely to the gate electrode than the intrinsic amorphous semiconductor layer, a second current path (resistance $R_c$ (ON)) is formed in a channel length direction of the n⁻-type layer 14 around an interface of the gate insulating film 13.

Then, a third current path (resistance $R_s$) is formed in the film thickness direction sequentially from the n⁻-type layer, the intrinsic amorphous semiconductor layer 15, the source region 16 which is an n⁺-type layer, and the source electrode 18.

An equivalent circuit of the drain current path 10 which corresponds to an arrow illustrated in FIG. 6A can be illustrated by a plurality of resistance connected in series, which are illustrated in FIG. 6B.

Since the first current path and the third current path are current paths in the film thickness direction, the length thereof is approximately 200 nm. Meanwhile, since the second current path is at least larger than the channel length, the length thereof is, for example, approximately larger than or equal to 6 μm. Further, since the first current path (resistance $R_d$) is connected in a forward direction, the first current path (resistance $R_d$) is considerably smaller resistance than the second current path (resistance $R_c$ (ON)) and the third current path (resistance $R_s$). By providing the n⁻-type layer between the intrinsic amorphous semiconductor layer and the gate insulating film, electric resistance around the interface of the gate insulating film is decreased, so that the main flow of drain current can be brought around the interface of the gate insulating film. Accordingly, on current of the TFT is increased.

Further, in manufacturing steps of the inverted-staggered TFT, an unnecessary n⁺-type layer over part (a region which serves as a channel) of the intrinsic amorphous semiconductor layer is selectively etched and over-etched to form a depressed portion in the intrinsic amorphous semiconductor layer. When the film thickness of a thin portion of the intrinsic amorphous semiconductor layer after the over-etching is approximately smaller than or equal to 150 nm, there is a possibility that the on characteristics of the TFT will be considerably decreased due to the interface state on the back channel side. Therefore, the film thickness of the intrinsic amorphous semiconductor layer is larger than 150 nm.

Furthermore, when the inverted-staggered TFT which has an n⁻-type layer is off, drain current can mainly flow through a portion to be etched (a back channel interface between the source electrode and the drain electrode) of the intrinsic amorphous semiconductor layer. Since the film thickness of the intrinsic amorphous semiconductor layer is larger than 150 nm, current hardly flows through the n⁻-type layer when the inverted-staggered TFT is off.

Therefore, in the inverted-staggered TFT which has an n⁻-type layer between the gate insulating film and the intrinsic amorphous semiconductor layer, on current can be increased and sufficient off current is provided.

It is necessary to consider field effect mobility more specifically. In the case where an appropriate positive potential is applied to the gate electrode, the source electrode is at a ground potential, and a positive potential is applied to the drain electrode (i.e., in the case where the TFT is on), the resistance $R_s$ illustrated in FIG. 6B mainly corresponds to the resistance value of the forward direction connection of the source region and the intrinsic amorphous semiconductor layer. In addition, the resistance $R_d$ mainly corresponds to the resistance value of a depleted n⁻-type layer, and the resistance $R_c$ (ON) corresponds to the resistance value of an inverted intrinsic amorphous semiconductor layer.

Note that an inverted intrinsic amorphous semiconductor layer refers to an intrinsic amorphous semiconductor layer in a state where a conduction electron is induced at an interface with a gate insulating film by applying a potential to a gate electrode. Note that it is likely that the resistance $R_s$ be considerably smaller than the resistance $R_d$ and the resistance $R_c$ (ON).

Here, in an actual device structure, the resistance $R_d$ is typically formed by using an intrinsic amorphous semiconductor layer approximately 200 nm in thickness. Meanwhile, the resistance $R_c$ (ON) is typically formed by using an n⁻-type layer approximately 6 μm in length. Therefore, in the case where the resistance value per unit length of the depleted intrinsic amorphous semiconductor layer is larger than (or smaller than) approximately thirty times the resistance value per unit length of an inverted n⁻-type layer, it is likely that the resistance $R_d$ (or the resistance $R_c$ (ON)) be dominant over drain current.

When gate voltage is increased, it is likely that the resistance $R_c$ (ON) changes from a value which is considerably larger than the resistance $R_d$ into a value which is the same or substantially the same as the resistance $R_d$, and into a value which is considerably smaller than the resistance $R_d$. When the resistance $R_c$ (ON) changes from the value which is considerably larger than the resistance $R_d$ into the value which is the same or substantially the same as the resistance $R_d$, it is likely that the drain current be drastically increased in accordance with decrease in the resistance $R_c$ (ON). On the other hand, when the resistance $R_c$ (ON) becomes the value which is considerably smaller than the resistance $R_d$, dependence on the drain current is decreased even when the resistance $R_c$ (ON) is decreased. Further, it is likely that the resistance value of the resistance $R_d$ is decreased as drain voltage is increased.

It is likely that the field effect mobility refer to a rate of increase of drain current $I_d$ with respect to increase in gate voltage $V_g$. Thus, the summary of the above-described content is as follows. That is, in the case where the drain voltage is low (the resistance $R_d$ is high), the field effect mobility has the maximum value in accordance with increase in gate voltage. Alternatively, in the case where the drain voltage is high (the resistance $R_d$ is low), the field effect mobility is increased monotonically in accordance with increase in gate voltage.

FIGS. 7A and 7B illustrate calculation results taking the fact that an $I_d$ curve is shifted negatively in a $V_g$ axis direction in accordance with increase in donor concentration into consideration, in addition to the above consideration.

The calculation was performed using a model illustrated in FIG. 6C with the device simulator "ATLAS" manufactured by Silvaco Data Systems Inc. Parameter of amorphous silicon used for the calculation was set to the following values. An energy gap $E_g$ was 1.9 eV; the state density nta of an acceptor at an end of a conduction band was 7.4E+21 [/eV]; the state density ntd of a donor at an end of a valence band was 7.4E+21 [/eV]; the attenuation coefficient wta of the state density of the acceptor at the end of the conduction band was 0.04; the attenuation coefficient wtd of the state density of the donor at the end of the valence band was 0.04; the total state density nga of an acceptor level in a Gaussian distribution was 3E+16 [/eV]; the total state density ngd of a donor level in the Gaussian distribution was 5E+18 [/eV]; the peak energy ega of the acceptor level in the Gaussian distribution was 0.5

[eV]; the peak energy egd of the donor level in the Gaussian distribution was 0.9 [eV]; the attenuation coefficient wga of the total state density of the acceptor in the Gaussian distribution was 0.4; and the attenuation coefficient wgd of the total state density of the donor in the Gaussian distribution was 0.3. Modeling of FIG. 6C was realized by mainly defining the state density. Specifically, the above-described parameters were defined as appropriate as the parameters of the model in FIG. 6C, and DC characteristics of an inverted-staggered amorphous silicon TFT were calculated with the device simulator. The calculation was repeated by changing the above-described parameters as appropriate until the obtained calculated values sufficiently reproduce DC characteristics of an actual device using an inverted-staggered amorphous silicon TFT.

The model illustrated in FIG. 6C is described below.

It is assumed that the substrate 11 which has an insulating surface be a glass substrate (with a thickness of 0.5 μm) which contains silicon oxide (with a dielectric constant of 4.1) as a main component. Note that the thickness of the substrate 11 which has an insulating surface is often 0.5 mm, 0.7 mm, or the like in actual manufacturing steps. The thickness of the substrate 11 which has an insulating surface is determined taking calculation efficiency into consideration while the substrate 11 which has an insulating surface is thick enough that an electric field on the lower surface of the insulating substrate does not affect TFT characteristics.

The gate electrode 12 which has a layered structure of aluminum and molybdenum (with a total thickness of 150 nm) is stacked over the substrate 11 which has an insulating surface. The work function of molybdenum is 4.6 eV. Note that in the model structure in FIG. 6C, the TFT characteristics do not depend on the material of the lower layer of the gate electrode (here aluminum). Thus, in order to simplify the calculation, the calculation is performed assuming that only molybdenum (with a thickness of 150 nm) is used.

The gate insulating film 13 formed of silicon nitride (with a dielectric constant of 7.0 and a thickness of 300 nm) is stacked over the gate electrode 12.

Over the gate insulating film 13, an n$^-$-type layer 20 which is represented by a-Si (n−) is stacked (the conditions are set so that the thickness is 10 nm, 20 nm, or 50 nm and the donor concentration is $1\times10^{15}$ cm$^{-3}$ to $5\times10^{17}$ cm$^{-3}$). Further, a third intrinsic layer 21c which is represented by third a-Si (i) is stacked thereover (the condition is set so that the thickness is 90 nm, 80 nm, or 50 nm).

Further, over the third intrinsic layer 21c, a first intrinsic layer 21a (with a thickness of 50 nm) which is represented by first a-Si (i) is stacked on one of sides and a second intrinsic layer 21b (with a thickness of 50 nm) which is represented by second a-Si (i) is stacked on the other of the sides.

The source region 16 (with a thickness of 50 nm) which is represented by first a-Si (n+) is stacked over the first a-Si (i). The drain region 17 (with a thickness of 50 nm) which is represented by second a-Si (n+) is stacked over the second a-Si (i).

In FIG. 6C, the distance between the source region 16 and the drain region 17 corresponds to the channel length L of the TFT. Here, the channel length L is 6 [μm]. In addition, the donor concentration of each of the source region 16 and the drain region 17 is $1\times10^{19}$ cm$^{-3}$, and each of the source region 16 and the drain region 17 has high conductivity.

Over the source region 16 and the drain region 17, the source electrode 18 and the drain electrode 19 which are each formed of a layered structure of molybdenum and aluminum (with a thickness of 300 nm) are stacked, respectively. It is assumed that ohmic contact be formed between molybdenum, and the source region 16 and the drain region 17. Note that the TFT characteristics of the device structure in FIG. 6C do not depend on the material of the upper layers of the source electrode and the drain electrode (here aluminum). Thus, in order to simplify the calculation, the calculation of the source electrode and the drain electrode is performed assuming that only molybdenum (with a thickness of 300 nm) is used.

FIG. 7A is a graph illustrating a relationship between the donor concentration and the maximum mobility of the n$^-$-type layer in the case where the drain voltage is low ($V_d=1$ V). The maximum mobility (the maximum field effect mobility) is determined by the maximum value of mobility (field effect mobility). In FIG. 7A, the maximum mobility is increased as the donor concentration is increased. By increasing the film thickness of a semiconductor layer to which an impurity is added, a semiconductor layer which contributes to conduction increases. Therefore, the mobility increases. The reason for this is that the n$^-$-type layer which is in an amorphous state has high resistance, so that the resistance $R_d$ is relatively lower than the resistance $R_c$ (ON).

FIG. 7B is a graph illustrating a relationship between the donor concentration and the maximum mobility of the n$^-$type layer in the case where the drain voltage is high ($V_d=14$ V). In FIG. 7B, the maximum mobility is increased as the donor concentration is increased. This can be described by taking negative shift of the threshold voltage due to addition of an impurity into consideration in addition to the consideration of the case where the drain voltage is high.

Further, since heat treatment for sufficiently activating phosphorus is not performed for the inverted-staggered TFT, all contained phosphorus atoms do not work as donors, and about 1% to 5%, typically 3% of the phosphorus atoms work as donors.

Note that the calculation with the device simulator is performed under the assumption that the n$^-$-type layer be a layer which has uniform donor concentration.

In addition, it is acceptable that the n$^-$-type layer is not a layer which has uniform concentration of phosphorus as long as it functions as an n$^-$-type layer. Instead, the n$^-$-type layer is preferably an n$^-$-type layer which has a concentration gradient so that the concentration peak of phosphorus is located around the interface of the gate insulating film. This is because off current increases as the concentration peak of phosphorus is shifted from the interface and to close to the n$^+$-type layer.

Note that in this specification, an intrinsic semiconductor refers to a substantially intrinsic semiconductor which has the following characteristics: the concentration of a contained impurity which imparts p-type or n-type conductivity is lower than or equal to $1\times10^{20}$ cm$^{-3}$, the concentration of phosphorus is lower than $6\times10^{15}$ cm$^{-3}$, which is the lower limit of the SIMS analysis of phosphorus, the concentration of each of oxygen and nitrogen is lower than or equal to $9\times10^{19}$ cm$^{-1}$, and photoconductivity is higher than or equal to 100 times dark conductivity.

In addition, in this specification, an n$^-$-type layer refers to an amorphous semiconductor layer which has the following characteristics: the concentration of phosphorus is higher than or equal to $6\times10^{15}$ cm$^{-3}$, which is the lower limit of the SIMS analysis of phosphorus, and the concentration of an impurity which imparts p-type conductivity is lower than one-tenth the concentration of phosphorus contained in the same layer.

Further, in this specification, an n-type semiconductor layer refers to a conductive microcrystalline or amorphous semiconductor layer where the concentration of an impurity which imparts n-type conductivity is higher than or equal to $1\times10^{19}/cm^{-3}$.

Moreover, concentration in this specification refers to a peak value of concentration obtained by analysis where SIMS (secondary ion mass spectrometry) is used. In the SIMS, a value is analyzed from the lower concentration side to the higher concentration side in a depth direction. In this specification, SIMS analysis is preferably performed from the gate insulating film side to the amorphous semiconductor layer side in a depth direction.

In an inverted-staggered TFT, by forming a thin n$^-$-type layer between an intrinsic amorphous silicon layer and a gate insulating film, the field effect mobility of the TFT can be improved. Further, a microcrystalline semiconductor film can be deposited efficiently.

BRIEF DESCRIPTION OF THE DRAWINGS

In the accompanying drawings:

FIGS. 18A and 18B are cross sectional views illustrating manufacturing steps of a light-emitting device of the present invention;

DETAILED DESCRIPTION OF THE INVENTION

Embodiment modes and embodiments of the present invention will be described below.

(Embodiment Mode 1)

In this embodiment mode, manufacturing steps of a thin film transistor used for a liquid crystal display device are described with reference to FIGS. 1A to 1C, FIGS. 2A to 2D, FIGS. 3A to 3C, and FIG. 4. FIGS. 1A to 1C, FIGS. 2A to 2D, and FIGS. 3A to 3C are cross-sectional views illustrating manufacturing steps of a thin film transistor.

Figure 4:
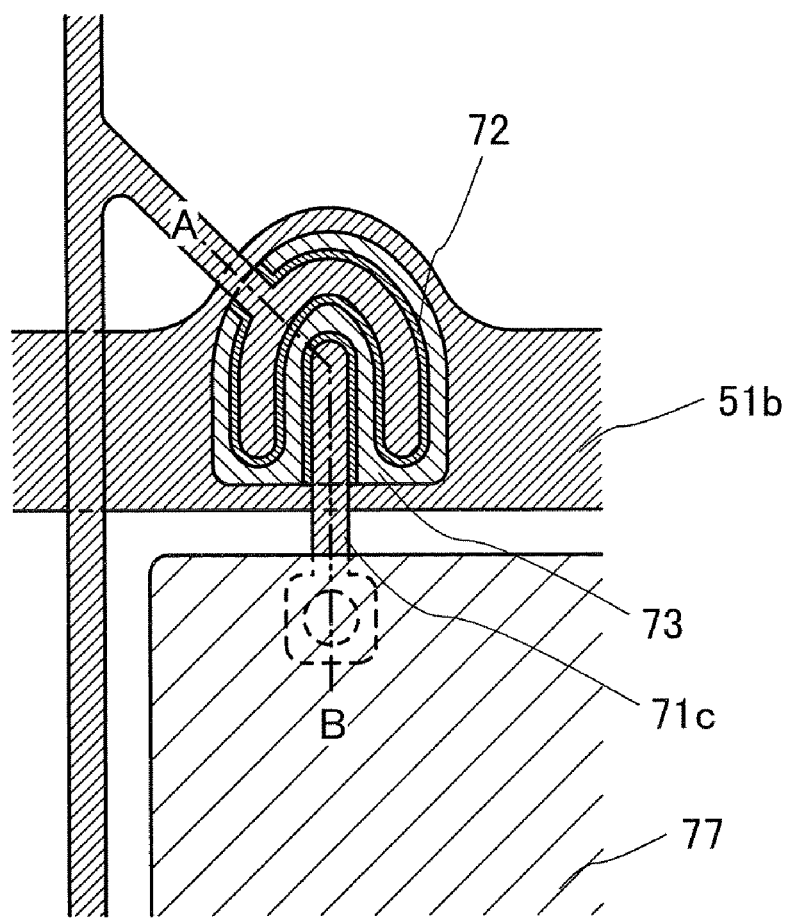
FIG. 4 is a top view illustrating a manufacturing step of the present invention.

FIG. 4 is a top view of a connection region of a thin film transistor and a pixel electrode in one pixel.

Figure 1A:
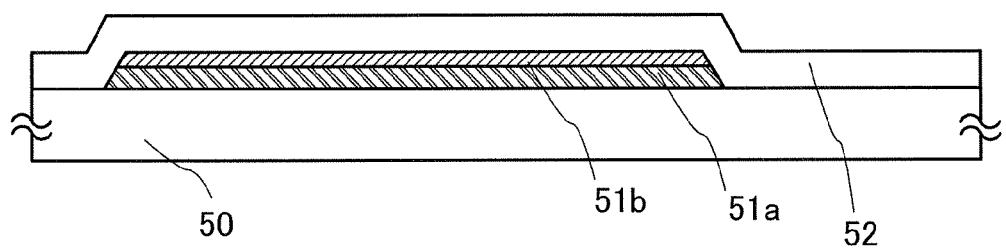
FIGS. 1A to 1C are cross-sectional views illustrating manufacturing steps of the present invention.

As illustrated in FIG. 1A, a gate electrode which is formed of a layered structure of metal layers is formed over a substrate 50.

As the substrate 50, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Alternatively, a metal substrate of a stainless alloy or the like with the surface provided with an insulating layer may be used. When the substrate 50 is a mother glass, the substrate may have any of the following sizes: the first generation (e.g., 320 mm×400 mm), the second generation (e.g., 400 mm×500 mm), the third generation (e.g., 550 mm×650 mm), the fourth generation (e.g., 680 mm×880 mm or 730 mm×920 mm), the fifth generation (e.g., 1000 mm×1200 mm or 1100 mm×1300 mm), the sixth generation (e.g., 1500 mm×1800 mm), the seventh generation (e.g., 1900 mm×2200 mm), the eighth generation (e.g., 2160 mm×2460 mm), the ninth generation (e.g., 2400 mm×2800 mm), the tenth generation (e.g., 2850 mm×3050 mm), and the like.

The gate electrode is formed using a metal material such as titanium, molybdenum, chromium, tantalum, tungsten, or aluminum, or an alloy material thereof. The gate electrode can be formed in such a manner that a conductive film is formed over the substrate 50 by a sputtering method; a mask is formed over the conductive film by a photolithography technique or an inkjet method; and the conductive film is etched using the mask. Alternatively, the gate electrode can be formed by discharging a conductive nanopaste of silver, gold, copper, or the like by an inkjet method and baking the conductive nanopaste. Note that as barrier metal which increases adhesion between the gate electrode and the substrate 50 and prevents diffusion to a base, a nitride film of any of the above-described metal materials may be provided between the substrate 50 and the gate electrode. Here, the gate electrode is formed by etching the layered films formed over the substrate 50 by using a resist mask formed using a first photomask.

As a specific structural example of the gate electrode, a structure may be used in which a molybdenum film which serves as a second conductive layer 51b is stacked over an aluminum film which serves as a first conductive layer 51a so that generation of a hillock and electromigration which are specific to aluminum are prevented. Since an example where a display device with a large display screen is manufactured using a large substrate is described in this embodiment mode, a gate electrode formed by stacking the first conductive layer 51a formed using aluminum, which has low electric resistance, and the second conductive layer 51b which has higher heat resistance properties than the first conductive layer 51a is used as the gate electrode. Alternatively, a three-layer structure in which an aluminum film is interposed between molybdenum films may be used. Further, as other structural examples of the gate electrode, a layered structure in which a molybdenum film is stacked over a copper film, a layered structure in which a titanium nitride film is stacked over a copper film, and a layered structure in which a tantalum nitride film is stacked over a copper film are given.

Note that since semiconductor films and wirings are formed over the gate electrode, it is preferable that the gate electrode be processed so that the end portions thereof are tapered in order to prevent disconnection. In addition, although not illustrated, in this step, a wiring which is connected to the gate electrode can be formed at the same time as forming the gate electrode.

Next, a gate insulating film 52 is formed over the second conductive layer 51b which is the upper layer of the gate electrode.

The gate insulating film 52 can be formed using a silicon nitride film, a silicon nitride film or a silicon nitride oxide film by a CVD method, a sputtering method, or the like. It is preferable that a plurality of different insulating layers be used for the gate insulating film 52 in order to prevent generation of interlayer short-circuit due to a pinhole or the like formed therein. Here, a mode where a silicon nitride film is formed as the gate insulating film 52 is shown. A cross-sectional view through the steps up to here corresponds to FIG. 1A.

Here, a silicon nitride oxide film refers to a film which contains more nitrogen than oxygen and contains oxygen, nitrogen, silicon, and hydrogen at concentrations ranging from 15 to 30 at. %, 20 to 35 at. %, 25 to 35 at. %, and 15 to 25 at. %, respectively.

Subsequently, after the gate insulating film is deposited, the substrate is transferred without being exposed to the atmosphere, and a microcrystalline semiconductor film is deposited in a vacuum chamber which is different from a vacuum chamber for forming the gate insulating film.

Before the substrate is transferred to a reaction chamber, hydrogen or a rare gas is introduced to generate plasma so that a gas (an atmospheric component such as oxygen or nitrogen, or an etching gas used for cleaning the reaction chamber) which attaches to the inner wall of the reaction chamber is removed. Then, hydrogen, a silane gas, and a small amount of phosphine ($PH_3$) gas are introduced. The silane gas can be reacted with oxygen, moisture, or the like in the reaction chamber. The small amount of phosphine gas can make phosphorus be contained in an amorphous silicon film which is deposited later.

Figure 1B:
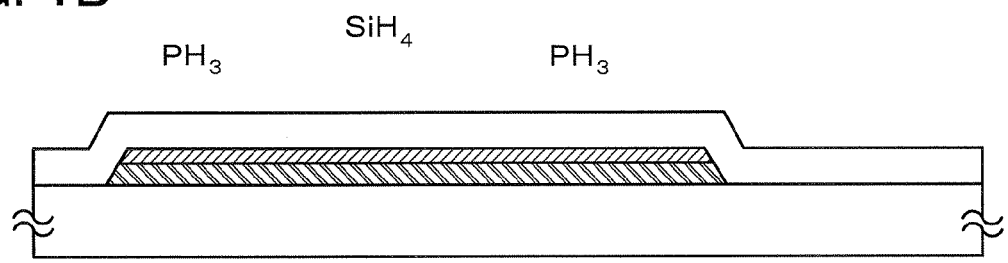

Subsequently, the substrate is transferred to the reaction chamber and is exposed to the silane gas and the small amount of a phosphine gas, as illustrated in FIG. 1B. Then, the amorphous silicon film is deposited. The amorphous silicon film can be deposited typically by diluting silicon hydride such as $SiH_4$ or $Si_2H_6$ with hydrogen to generate plasma. Amorphous silicon which contains hydrogen can be formed by using hydrogen with a flow rate more than or equal to 1 times and less than or equal to 10 times the flow rate of silicon hydride, preferably with a flow rate more than or equal to 1 times and less than or equal to 5 times the flow rate of silicon hydride.

Figure 1C:
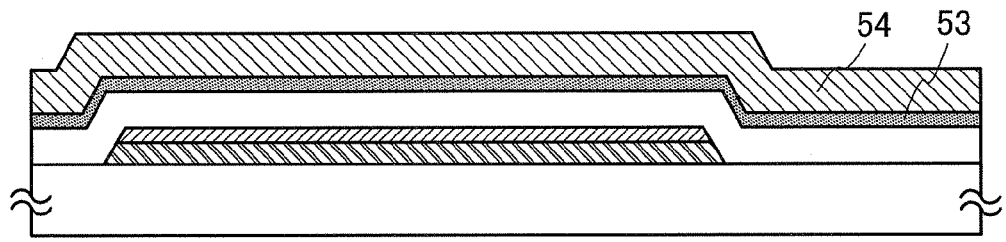

Further, through the above-described procedures, the amorphous silicon film around the interface of the gate insulating film is made to contain phosphorus so as to have n-type conductivity. Therefore, as illustrated in FIG. 1C, a layered structure of an amorphous silicon film 53 which is made to have n-type conductivity and an intrinsic amorphous silicon film 54 is formed. Although the interface between the amorphous silicon film 53 which is made to have n-type conductivity and the intrinsic amorphous silicon film 54 is illustrated in FIG. 1C for understandability, in the amorphous silicon film, actually, the concentration of phosphorus decreases as a distance from the interface of the gate insulating film increases.

Moreover, through the above-described procedure, the concentration of not only oxygen but also nitrogen and carbon, which are mixed around the interface between the amorphous silicon film and the gate insulating film, can be reduced.

Subsequently, after the intrinsic amorphous silicon film 54 is deposited, the substrate is transferred without being exposed to the atmosphere, and a semiconductor film 55 to which an impurity which imparts one conductivity is added is preferably deposited in a vacuum chamber which is different from a vacuum chamber for forming the intrinsic amorphous silicon film.

As for the semiconductor film 55 to which an impurity which imparts one conductivity is added, phosphorus may be added as a typical impurity element and an impurity gas such as a phosphine gas may be added to silicon hydride. The semiconductor film 55 to which an impurity which imparts one conductivity is added is formed to a thickness larger than or equal to 2 nm and smaller than or equal to 50 nm. By thinning the film thickness of the semiconductor film to which an impurity which imparts one conductivity is added, throughput can be improved.

Figure 2A:
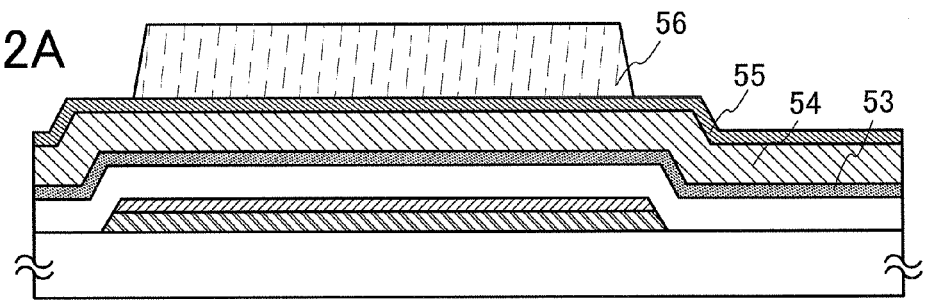
FIGS. 2A to 2D are cross-sectional views illustrating manufacturing steps of the present invention.

Subsequently, as illustrated in FIG. 2A, a resist mask 56 is formed over the semiconductor film 55 to which an impurity which imparts one conductivity is added. The resist mask is formed by a photolithography technique or an inkjet method. Here, the resist mask 56 is formed by exposing to light a resist applied over the semiconductor film 55 to which an impurity which imparts one conductivity is added and developing the resist, by using a second photomask.

Figure 2B:
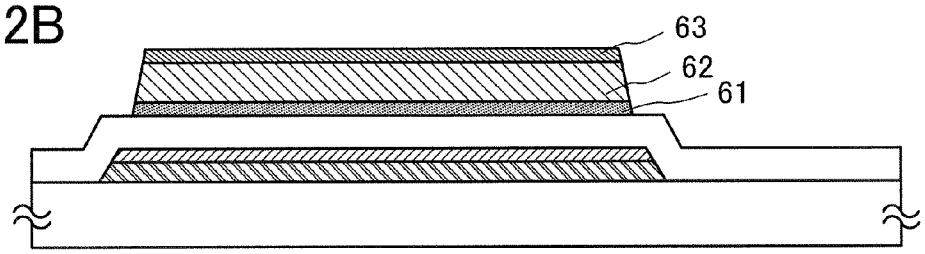

Subsequently, by etching the amorphous silicon film 53 which is made to have n-type conductivity, the intrinsic amorphous silicon film 54, and the semiconductor film 55 to which an impurity which imparts conductivity is added, by using the resist mask 56, an amorphous silicon film 61 which is made to have n-type conductivity, an intrinsic amorphous silicon film 62, and a semiconductor film 63 to which an impurity which imparts one conductivity is added are formed, as illustrated in FIG. 2B. After that, the resist mask 56 is removed.

Since the side surfaces of the end portions of the amorphous silicon film 61 which is made to have n-type conductivity and the intrinsic amorphous silicon film 62 are inclined, generation of leakage current between the amorphous silicon film 61 which is made to have n-type conductivity and source and drain regions formed over the intrinsic amorphous silicon film 62 can be prevented. Further, generation of leakage current between the amorphous silicon film 61 which is made to have n-type conductivity and source and drain electrodes can be prevented. Each of the inclination angles of the side surfaces of the end portions of the amorphous silicon film 61 which is made to have n-type conductivity and the intrinsic amorphous silicon film 62 is greater than or equal to 30° and less than or equal to 90°, preferably greater than or equal to 45° and less than or equal to 80°. With such an angle, disconnection of the source or drain electrode due to a step shape can be prevented.

Figure 2C:
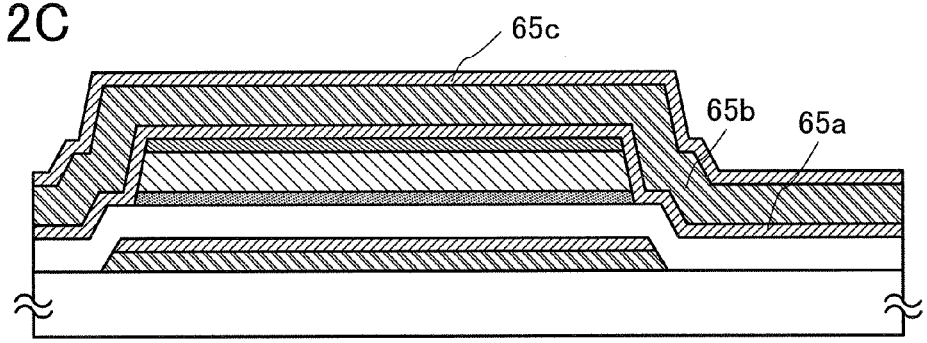

Next, as illustrated in FIG. 2C, conductive films 65a to 65c are formed as conductive films so as to cover the semiconductor film 63 to which an impurity which imparts one conductivity is added and the gate insulating film 52. Each of the conductive films 65a to 65c is preferably formed of a single-layer structure or a layered structure of aluminum, copper, or an aluminum alloy to which an element to improve heat resistance, such as silicon, titanium, neodymium, scandium, or molybdenum or an element to prevent a hillock is added. Alternatively, each of the conductive films 65a to 65c may have a layered structure where a layer on the side which is in contact with the semiconductor film to which an impurity which imparts one conductivity is added is formed using titanium, tantalum, molybdenum, tungsten, or nitride of any of these elements and aluminum or an aluminum alloy is formed thereover. Further alternatively, each of the conductive films 65a to 65c may have a layered structure where an upper side and a lower side of aluminum or an aluminum alloy is interposed with titanium, tantalum, molybdenum, tungsten, or nitride of any of these elements. Here, a conductive film where three layers of the conductive films 65a to 65c are stacked is illustrated as the conductive film, and a layered conductive film where molybdenum films are used as the conductive films 65a and 65c and an aluminum film is used as the conductive film 65b is illustrated. Each of the conductive films 65a to 65c is formed by a sputtering method or a vacuum evaporation method.

Figure 2D:
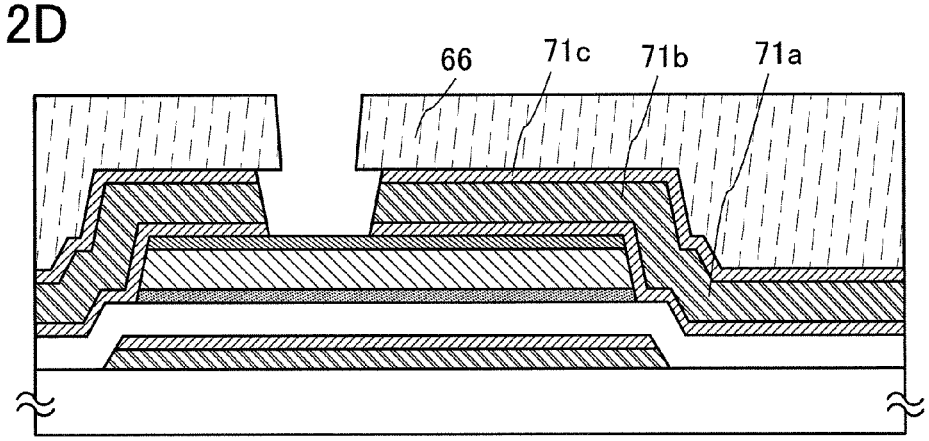

Next, as illustrated in FIG. 2D, a resist mask 66 is formed over the conductive films 65a to 65c by using a third photomask, and the conductive films 65a to 65c are partly etched to form source and drain electrodes 71a to 71c. By performing wet etching on the conductive films 65a to 65c, the end portions of the conductive films 65a to 65c are selectively etched. Accordingly, the end portions of the conductive films are isotropically etched, so that the source and drain electrodes 71a to 71c which have a smaller area than the resist mask 66 can be formed.

Figure 3A:
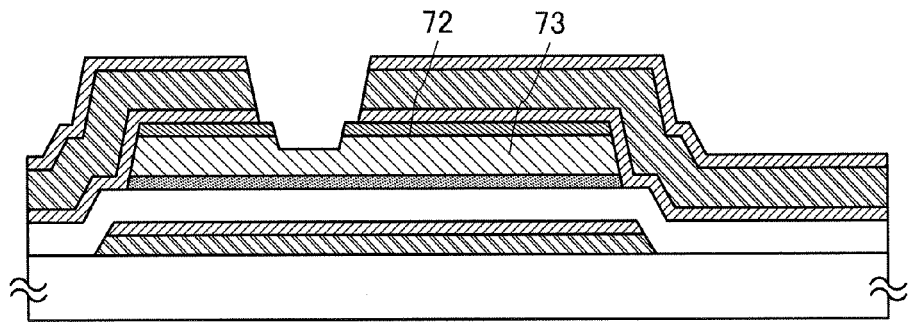
FIGS. 3A to 3C are cross-sectional views illustrating manufacturing steps of the present invention.

Next, as illustrated in FIG. 3A, the semiconductor film 63 to which an impurity which imparts one conductivity is added is etched by using the resist mask 66 to form a pair of source and drain regions 72. Further, in the etching step, the intrinsic amorphous silicon film 62 is also partly etched. The intrinsic amorphous silicon film which is partly etched and provided with a hollow (a groove) is denoted by an intrinsic amorphous silicon film 73. The pair of source and drain regions and the hollow (the groove) of the intrinsic amorphous silicon film can be formed in the same steps. By forming the hollow (the groove) of the intrinsic amorphous silicon film with a depth which is greater than or equal to half and less than or equal to one-third the thickness of a region having the largest thickness of the intrinsic amorphous silicon film, the pair of source and drain regions can be separated from each other. Therefore, leakage current between the pair of source and drain regions can be reduced. After that, the resist mask 66 is removed.

In particular, the resist mask transforms when it is exposed to plasma used for dry etching or the like, the resist mask is not completely removed in the resist removal step, and a residue thereof remains. In order to prevent this, the intrinsic amorphous silicon film is etched by approximately 50 nm. The resist mask 66 is used twice, that is for the etching treatment of part of the conductive films 65a to 65c and the etching treatment at the time of forming the pair of source and drain regions 72. In the case where dry etching is used for both the etching treatments, a residue tends to remain. Thus, it is effective to form the intrinsic amorphous silicon film which may be etched when the residue is completely removed with large film thickness.

Figure 3B:
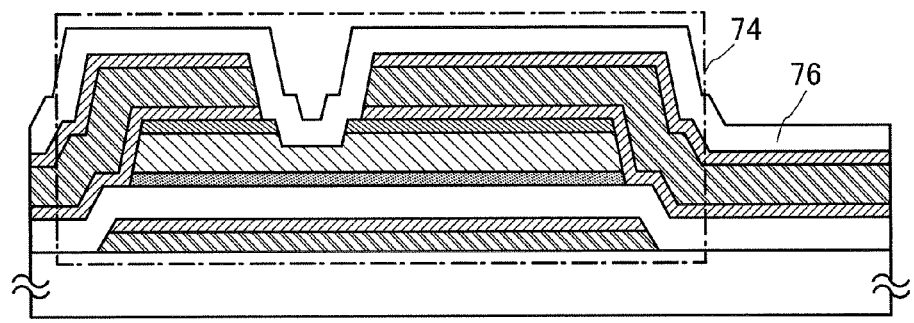
Figure 3C:
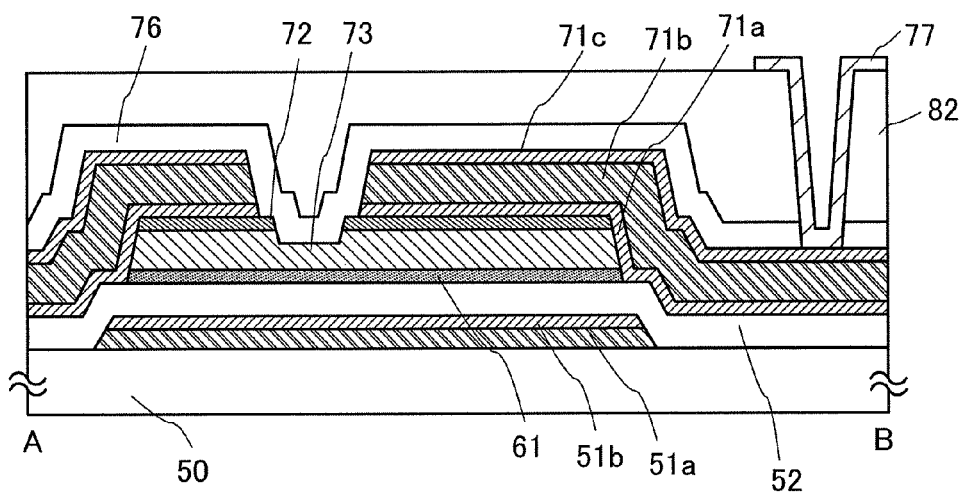

Next, as illustrated in FIG. 3B, an insulating film 76 which covers the source and drain electrodes 71a to 71c, the pair of source and drain regions 72, the intrinsic amorphous silicon film 73, the amorphous silicon film 61 which is made to have n-type conductivity, and the gate insulating film 52 is formed. The insulating film 76 can be formed by using the same deposition method as the gate insulating film 52. Note that since the insulating film 76 is provided in order to prevent entry of a contaminant impurity such as an organic substance, a metal substance, or moisture floating in the atmosphere, the insulating film 76 is preferably formed precisely. In addition, by using a silicon nitride film as the insulating film 76, the oxygen concentration in intrinsic amorphous silicon film 73 can be lower than or equal to $5\times10^{19}$ atoms/cm$^3$, preferably lower than or equal to $1\times10^{19}$ atoms/cm$^3$.

When the end portions of the source and drain electrodes 71a to 71c and the end portions of the pair of source and drain regions 72 are not aligned with each other as illustrated in FIG. 3B, a distance between the end portions of the source and drain electrodes 71a to 71c is long. Therefore, generation of leakage current between the source electrode and the drain electrode and short circuit can be prevented. Further, since the end portions of the source and drain electrodes 71a to 71c and the end portions of the pair of source and drain regions 72 are not aligned with each other, an electric field does not concentrate on the end portions of the source and the drain electrodes 71a to 71c and the end portions of the source and drain regions 72, and generation of leakage current between the gate electrode and the source and drain electrodes 71a to 71c can be prevented. Therefore, a thin film transistor with high reliability and high withstand voltage can be manufactured.

Through the above-described steps, a thin film transistor 74 can be formed.

As for the thin film transistor illustrated in this embodiment mode, the gate insulating film, the amorphous silicon film which is made to have n-type conductivity, the intrinsic amorphous silicon film, source and drain regions, and source and drain electrodes are stacked over the gate electrode. In addition, the hollow (the groove) is formed in part of the intrinsic amorphous silicon film, and regions other than the hollow are covered with the source and drain regions. That is, due to the hollow formed in the intrinsic amorphous silicon film, a distance between the source and drain region is long. Thus, leakage current between the source and drain region can be reduced. Further, since the hollow is formed by partly etching the intrinsic amorphous silicon film, an etching residue which is generated in the formation step of the source and drain regions can be removed. Accordingly, generation of leakage current (parasitic channel) between the source and drain regions due to the etching residue can be prevented.

Next, a planarization film 82 is formed over the insulating film 76. The planarization film 82 is formed using an organic resin film. Subsequently, a contact hole is formed by partly etching the insulating film 76 and the planarization film 82 by using a resist mask formed using a fourth photomask. Then, a pixel electrode 77 which is in contact with the source or drain electrode 71c in the contact hole is formed. Note that FIG. 3C corresponds to a cross-sectional view taken along chain line A-B in FIG. 4.

As illustrated in FIG. 4, it can be seen that the end portions of the pair of source and drain regions 72 are located outer side than the end portions of the source or drain electrode 71c. In addition, the end portions of the intrinsic amorphous silicon film 73 are located outer side than the end portions of the source or drain electrode 71c and the end portions of the pair of source and drain regions 72. Further, one of the source electrode and the drain electrode has a shape of surrounding the other of the source electrode and the drain electrode (specifically a U-shape or a C-shape). Therefore, the area of a region through which carries transfer can be increased, so that the amount of current can be increased and the area of the thin film transistor can be reduced. Note that the one of the source electrode and the drain electrode also functions as a source wiring or a drain wiring.

Further, for the pixel electrode 77, a light-transmitting conductive material such as indium oxide which contains tungsten oxide, indium zinc oxide which contains tungsten oxide, indium oxide which contains titanium oxide, indium tin oxide which contains titanium oxide, indium tin oxide, indium zinc oxide, or indium tin oxide to which silicon oxide is added can be used.

Alternatively, the pixel electrode 77 can be formed using a conductive composition which contains a conductive high molecular compound (also referred to as a conductive polymer). It is preferable that the pixel electrode formed using the conductive composition have a sheet resistance lower than or equal to 10000 Ω/square and a light transmittance higher than or equal to 70% at a wavelength of 550 nm. The sheet resistance of the pixel electrode is preferably lower. In addition, it is preferable that the resistivity of the conductive high molecular compound contained in the conductive composition be less than or equal to 0.1 Ω·cm.

Note that as the conductive high molecular compound, a so-called π electron conjugated conductive high molecular compound can be used. Examples of the conductive high molecular compound are polyaniline and its derivatives, polypyrrole and its derivatives, polythiophene and its derivatives, copolymers of two or more kinds of them, and the like.

Here, as the pixel electrode 77, after an indium tin oxide film is deposited by a sputtering method, a resist is applied over the indium tin oxide film. Next, the resist is exposed to light and is developed by using a fifth photomask, so that a resist mask is formed. Then, the indium tin oxide film is etched by using the resist mask to form the pixel electrode 77.

Through the above-described steps, an element substrate which can be used for a display device can be formed.

(Embodiment Mode 2)

Figure 5:
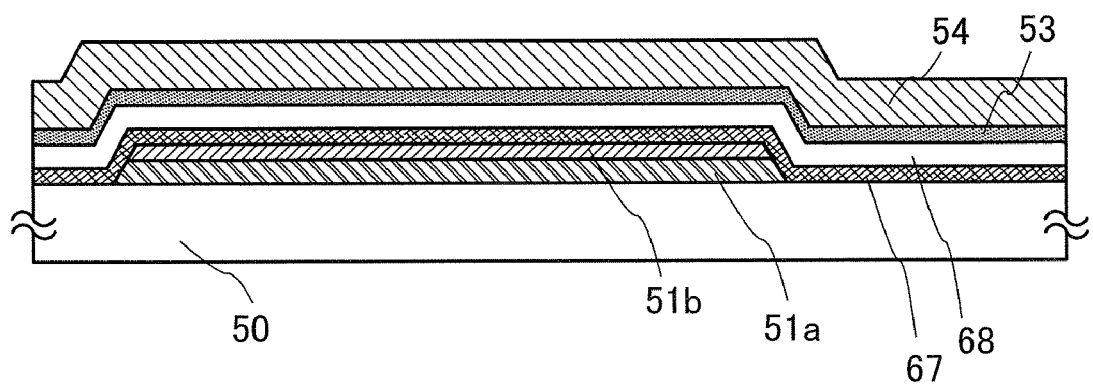
FIG. 5 is a cross-sectional view illustrating a manufacturing step of the present invention.

Although the example where an amorphous silicon film which is made to have n-type conductivity and an intrinsic amorphous silicon film are stacked by depositing an amorphous silicon film after the substrate is exposed to a silane gas and a small amount of phosphine gas is illustrated in Embodiment Mode 1, the present invention is not particularly limited to this. A method may be used by which a gate insulating film has a layered structure and a lower layer thereof is made to contain phosphorus, so that an intrinsic amorphous silicon film is deposited thereabove and an amorphous silicon film which is made to have n-type conductivity is formed around the interface of the gate insulating film. This example is described with reference to FIG. 5.

Another method for manufacturing a semiconductor device, which is disclosed in this specification includes, the following steps: forming a gate electrode over a substrate which has an insulating surface, forming an insulating layer which contains phosphorus over the gate electrode, forming an n-type amorphous semiconductor layer over the insulating layer which contains phosphorus, forming an amorphous semiconductor layer which has larger film thickness than the n-type amorphous semiconductor layer over the n-type amorphous semiconductor layer, forming an n-type semiconductor layer which contains phosphorus at higher concentration than the n-type amorphous semiconductor layer over the amorphous semiconductor layer, and forming a source electrode or a drain electrode over the n-type semiconductor layer.

A gate electrode is formed in a manner similar to that of Embodiment Mode 1. After that, a first gate insulating film 67 and a second gate insulating film 68 are formed. As the first gate insulating film 67, a silicon nitride film which contains phosphorus or a silicon oxynitride film which contains phosphorus is used. A silicon oxynitride film refers to a film which contains more oxygen than nitrogen and contains oxygen, nitrogen, silicon, and hydrogen at concentrations ranging from 55 to 65 at. %, 1 to 20 at. %, 25 to 35 at. %, and 0.1 to 10 at. %, respectively.

Here, as the first gate insulating film 67, deposition is performed under the following conditions: the flow rate of a silane gas is 30 sccm, the flow rate of an $N_2O$ gas is 1200 sccm, the flow rate of a gas obtained by diluting a phosphine gas with hydrogen by 0.5%, and the film thickness is 10 nm. Further, the film thickness of the second gate insulating film 68 is 100 nm. Note that in order to illustrate the film thickness of the second gate insulating film 68 clearly, the film thickness thereof is illustrated thick and the film thickness ratio is varied in the drawing.

Subsequently, by depositing an amorphous silicon film without being exposed to the atmosphere, the amorphous silicon film can also be made to contain phosphorus. In this manner, a layered structure of an amorphous silicon film which is made to have n-type conductivity and an intrinsic amorphous silicon film can be formed. The subsequent steps may be performed in a manner similar to that of Embodiment Mode 1.

Further, in a manner similar to that of Embodiment Mode 1, phosphine is not continuously supplied. Thus, a concentration profile is shown in a depth direction where the concentration peak of phosphorus is located around the gate insulating film.

(Embodiment Mode 3)

Although the example where an amorphous silicon film which is made to have n-type conductivity and an intrinsic amorphous silicon film are stacked by depositing an amorphous silicon film after the substrate is exposed to a silane gas and a small amount of phosphine gas is illustrated in Embodiment Mode 1, the present invention is not particularly limited to this. By depositing an amorphous silicon film which contains phosphorus on the inner wall of a chamber before a gate insulating film is formed, a layered structure of an amorphous silicon film which is made to have n-type conductivity and an intrinsic amorphous silicon film may be formed.

Another method for manufacturing a semiconductor device, which is disclosed in this specification includes, the following steps: forming a gate electrode over a substrate which has an insulating surface, forming an insulating layer and an n-type amorphous semiconductor layer in a chamber where a semiconductor film which contains phosphorus is formed on the inner wall; forming an amorphous semiconductor layer which has larger film thickness than the n-type amorphous semiconductor layer over the n-type amorphous semiconductor layer, forming an n-type semiconductor layer which contains phosphorus at higher concentration than the n-type amorphous semiconductor layer over the amorphous semiconductor layer, transferring the substrate from the chamber, and forming a source electrode or a drain electrode over the n-type semiconductor layer.

A gate electrode is formed in a manner similar to that of Embodiment Mode 1. After that, an about 50-nm-thick amorphous silicon film which contains phosphorus is deposited on the inner wall of a chamber. Subsequently, a gate insulating film is formed in a manner similar to that of Embodiment Mode 1. Then, by depositing an amorphous silicon film without being exposed to the atmosphere, the amorphous silicon film can also be made to contain phosphorus. In this manner, a layered structure of an amorphous silicon film which is made to have n-type conductivity and an intrinsic amorphous silicon film can be formed.

In addition, after a second n-type amorphous semiconductor layer which contains phosphorus at high concentration is formed over the intrinsic amorphous silicon film by using the same chamber, the substrate is transferred from the chamber. Since an amorphous silicon film which contains phosphorus is deposited again on the inner wall of the chamber when the second n-type amorphous semiconductor layer is formed, it is also possible to sequentially perform treatment on another substrate. The subsequent steps may be performed in a manner similar to that of Embodiment Mode 1.

Further, in a manner similar to that of Embodiment Mode, phosphine is not continuously supplied. Thus, a concentration profile is shown in a depth direction where the concentration peak of phosphorus is located around the gate insulating film.

In this manner, a layered structure of an amorphous silicon film which is made to have n-type conductivity and an intrinsic amorphous silicon film can be formed with various methods.

(Embodiment Mode 4)

Next, a method for manufacturing a thin film transistor, which is different from that of Embodiment Mode 1, is described with reference to FIGS. 8A to 8D, FIGS. 9A and 9B, FIGS. 10A to 10C, FIGS. 11A and 11B, and FIGS. 12A to 12C. Here, steps are illustrated in which a thin film transistor is manufactured through a process by which the number of photomasks can be made smaller than that of Embodiment Mode 1.

In a manner similar to that of FIG. 1A described in Embodiment Mode 1, a layered structure of conductive films is formed over the substrate 50, a resist is applied to the layered structure of conductive films, and the conductive films are partly etched by using a resist mask which is formed in a photolithography process using a first photomask to form a gate electrode. Next, the gate insulating film 52 is formed over the gate electrode.

Next, in a manner similar to that of FIG. 1B described in Embodiment Mode 1, the gate insulating film 52 is exposed to an atmosphere which contains a phosphine gas in a small amount.

Next, in a manner similar to that of FIG. 1C described in Embodiment Mode 1, an amorphous silicon film is deposited over the gate insulating film 52, and a layered structure of the amorphous silicon film 53 which is made to have n-type conductivity and the intrinsic amorphous silicon film 54 is formed.

Figure 9A:
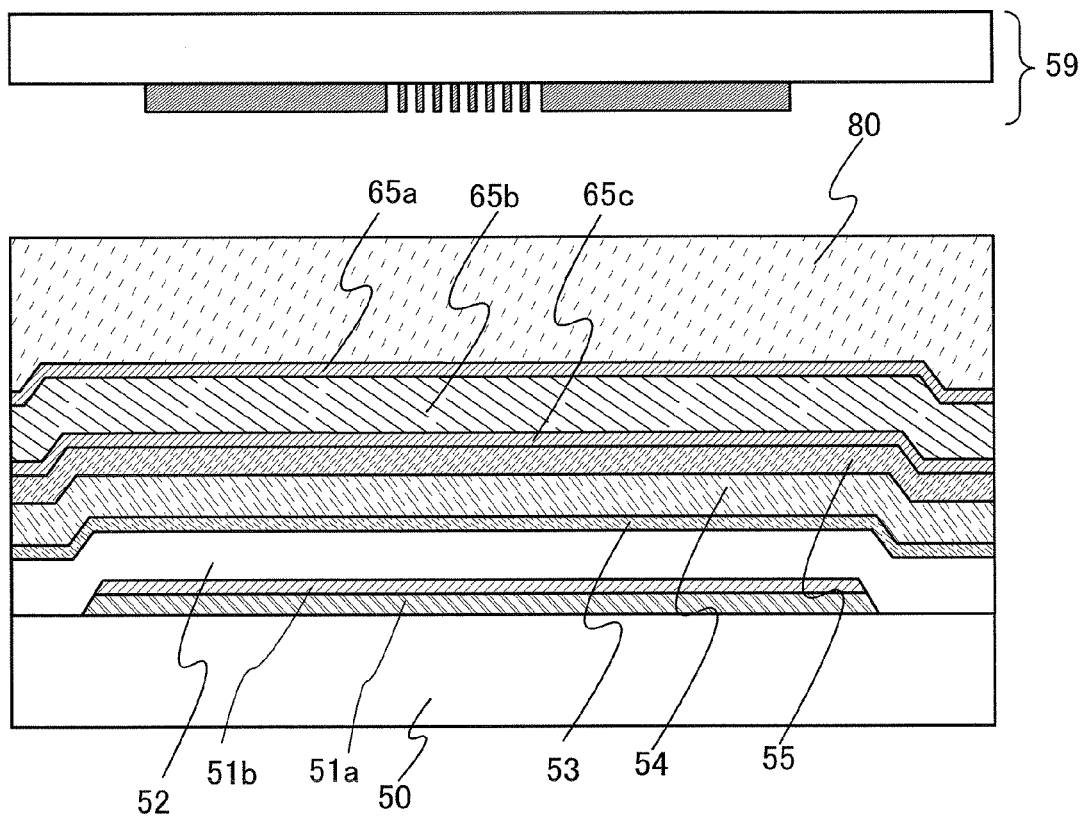
FIGS. 9A and 9B are cross-sectional views illustrating manufacturing steps of the present invention.

Next, the semiconductor film 55 to which an impurity which imparts one conductivity is added and the conductive films 65a to 65c are sequentially formed. Then, as illustrated in FIG. 9A, a resist 80 is applied to the conductive film 65a.

Either a positive resist or a negative resist can be used as the resist 80. Here, a positive resist is used.

Next, the resist 80 is irradiated with light by using a multi-tone mask 59 as a second photomask so as to be exposed to light.

Here, light exposure with the multi-tone mask 59 is described with reference to FIGS. 8A to 8D.

A multi-tone mask refers to a mask which can achieve three levels of light exposure to obtain an exposed portion, a half-exposed portion, and an unexposed portion and can form a resist mask with regions of a plurality of thicknesses (typically two kinds of thicknesses) by one-time exposure and development process. Thus, the number of photomasks can be reduced by using a multi-tone mask.

Figure 8A:
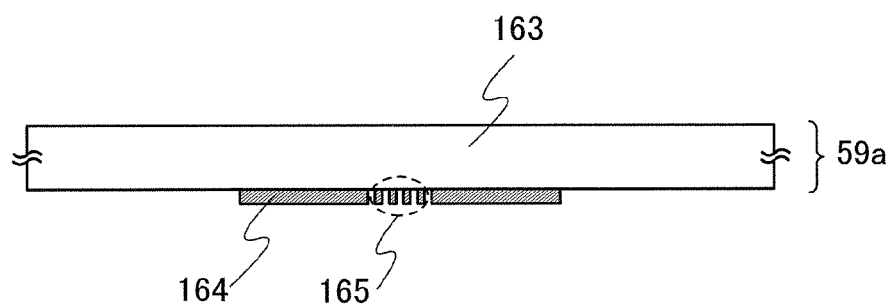
FIGS. 8A to 8D are cross-sectional views each illustrating a multi-tone mask which can be used for the present invention.
Figure 8B:
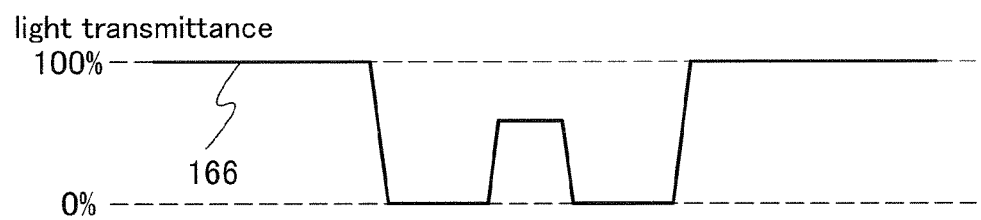
Figure 8C:
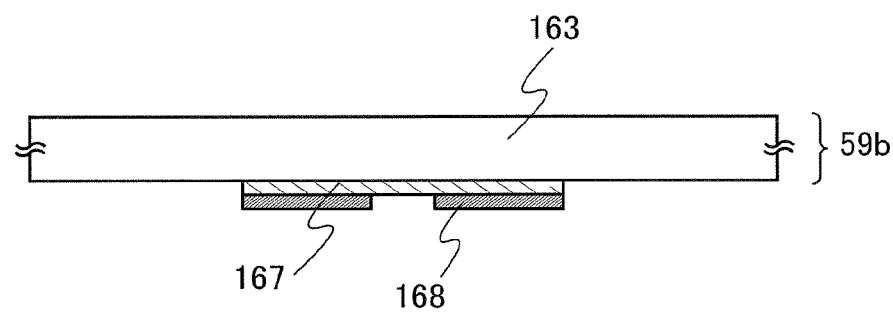

Typical examples of a multi-tone mask are a gray-tone mask 59a as illustrated in FIG. 8A and a half-tone mask 59b as illustrated in FIG. 8C.

As illustrated in FIG. 8A, the gray-tone mask 59a includes a light-transmitting substrate 163, a light-shielding portion 164 formed thereon, and a diffraction grating 165. The light transmittance of the light-shielding portion 164 is 0%. The diffraction grating 165 has a light-transmitting portion in a slit form, a dot form, a mesh form, or the like with intervals less than or equal to the resolution limit of light used for the exposure, so that the light transmittance can be controlled. Note that the diffraction grating 165 can be in a regular slit form, a regular dot form, or a regular mesh form, or in an irregular slit form, an irregular dot form, or an irregular mesh form.

As the light-transmitting substrate 163, a light-transmitting substrate such as a quartz substrate can be used. Each of the light-shielding portion 164 and the diffraction grating 165 can be formed using a light-shielding material which absorbs light, such as chromium or chromium oxide.

When the gray-tone mask 59a is irradiated with light for exposure, light transmittance 166 of the light-shielding portion 164 is 0% and the light transmittance of a region where the light-shielding portion 164 and the diffraction grating 165 are not provided is 100%, as illustrated in FIG. 8B. Further, the light transmittance of the diffraction grating 165 can be controlled in the range of 10 to 70%. The light transmittance of the diffraction grating 165 can be controlled by controlling the interval and pitch of slits, dots, or meshes of the diffraction grating.

As illustrated in FIG. 8C, the half-tone mask 59b includes the light-transmitting substrate 163, a transflective portion 167 formed thereon, and a light-shielding portion 168. The transflective portion 167 can be formed using MoSiN, MoSi, MoSiO, MoSiON, CrSi, or the like. The light-shielding portion 168 can be formed using a light-shielding material which absorbs light, such as chromium or chromium oxide.

Figure 8D:
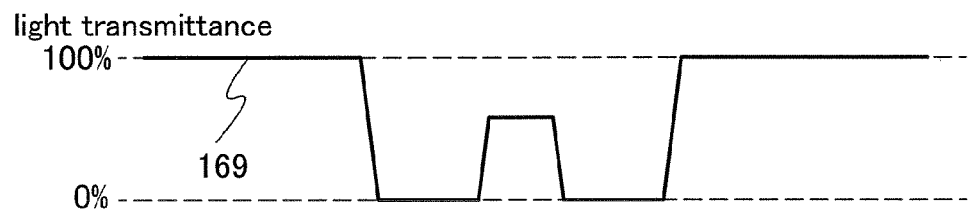

When the half-tone mask 59b is irradiated with light for exposure, light transmittance 169 of the light-shielding portion 168 is 0% and the light transmittance of a region where the light-shielding portion 168 and the transflective portion 167 are not provided is 100%, as illustrated in FIG. 8D. Further, the light transmittance of the transflective portion 167 can be controlled in the range of 10 to 70%. The light transmittance of the transflective portion 167 can be controlled by controlling the material of the transflective portion 167.

Figure 9B:
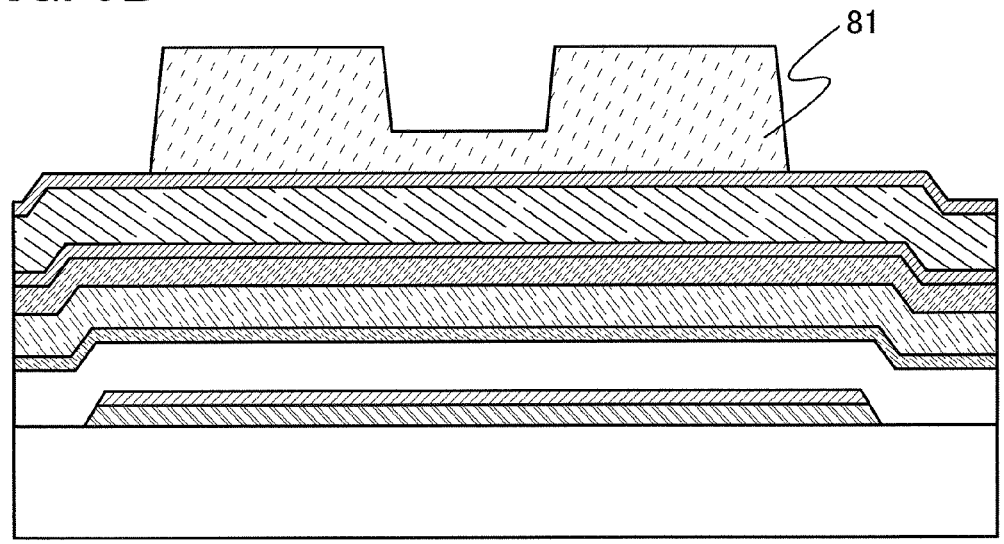

By performing development after the light exposure is performed using the multi-tone mask, a resist mask 81 which has regions with different thicknesses can be formed, as illustrated in FIG. 9B.

Figure 10A:
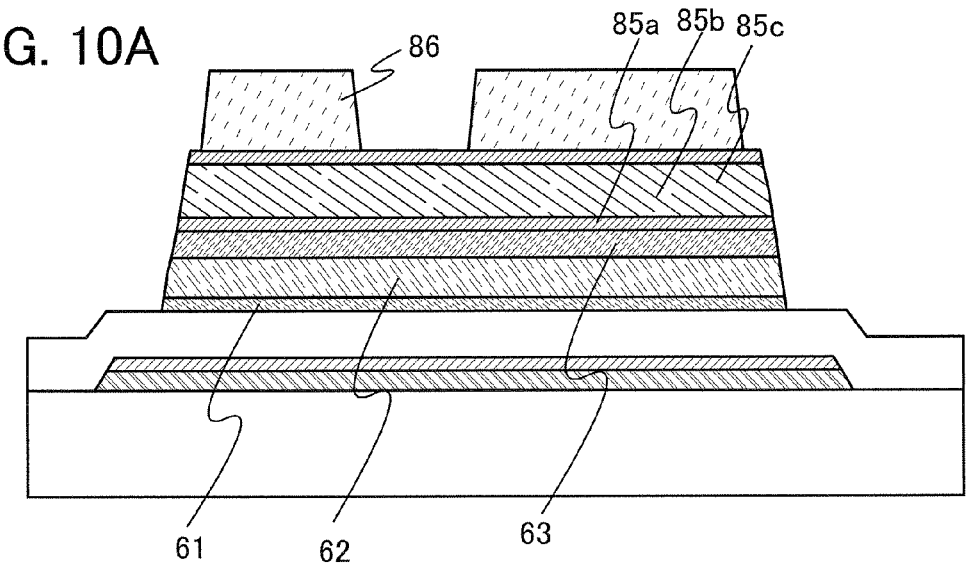
FIGS. 10A to 10C are cross-sectional views illustrating manufacturing steps of the present invention.

Next, the amorphous silicon film 53 which is made to have n-type conductivity, the intrinsic amorphous silicon film 54, the semiconductor film 55 to which an impurity which imparts one conductivity is added, and the conductive films 65a to 65c are etched to be separated by using the resist mask 81. Accordingly, the amorphous silicon film 61 which is made to have n-type conductivity, the intrinsic amorphous silicon film 62, the semiconductor film 63 to which an impurity which imparts one conductivity is added, and conductive films 85a to 85c can be formed, as illustrated in FIG. 10A. Note that FIG. 10A corresponds to a cross-sectional view taken along A-B in FIG. 12A (though resist masks 86 are not illustrated).

Next, ashing is performed on the resist mask 81. Accordingly, the area and thickness of the resist are decreased. At this time, the resist mask in a region with small thickness (a region overlapping with part of the gate electrode 51) is removed, so that the separated resist masks 86 can be formed, as illustrated in FIG. 10A.

Figure 10B:
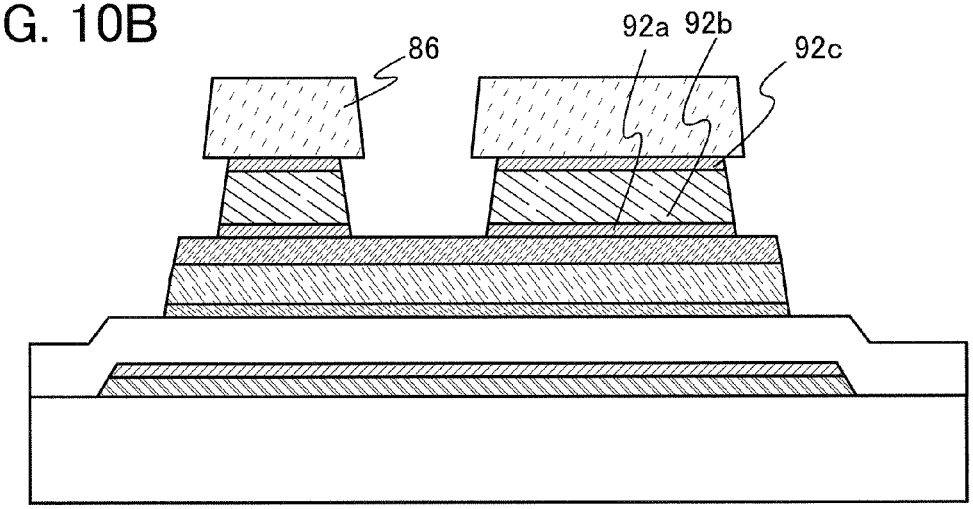

Next, the conductive films 85a to 85c are etched to be separated by using the resist masks 86. Accordingly, a pair of source and drain electrodes 92a, a pair of source and drain electrodes 92b, and a pair of source and drain electrodes 92c can be formed, as illustrated in FIG. 10B. By performing wet etching on the conductive films 85a to 85c by using the resist masks 86, the end portions of the conductive films 85a to 85c are selectively etched. Accordingly, the conductive films are etched isotropically, so that source and drain electrodes 92a to 92c which have smaller areas than the resist masks 86 can be formed.

Next, the semiconductor film 63 to which an impurity which imparts one conductivity is added is etched by using the resist masks 86 to form a pair of source and drain regions 88. Note that in the etching step, the intrinsic amorphous silicon film 62 is also partly etched. The intrinsic amorphous silicon film which is partly etched is denoted by an intrinsic amorphous silicon film 87. Note that a depressed portion is formed in the intrinsic amorphous silicon film 87. The pair of source and drain regions and the depressed portion of the intrinsic amorphous silicon film can be formed in the same steps. Here, since the intrinsic amorphous silicon film 87 is partly etched by using the resist masks 86 which have smaller areas than the resist mask 81, the intrinsic amorphous silicon film 87 protrudes outside the pair of source and drain regions 88. After that, the resist masks 86 are removed. The end portions of the source and drain electrodes 92a to 92c are not aligned with the end portions of the pair of source and drain regions 88, and the end portions of the pair of source and drain regions 88 are formed outside the end portions of the source and drain electrodes 92a to 92c.

Figure 10C:
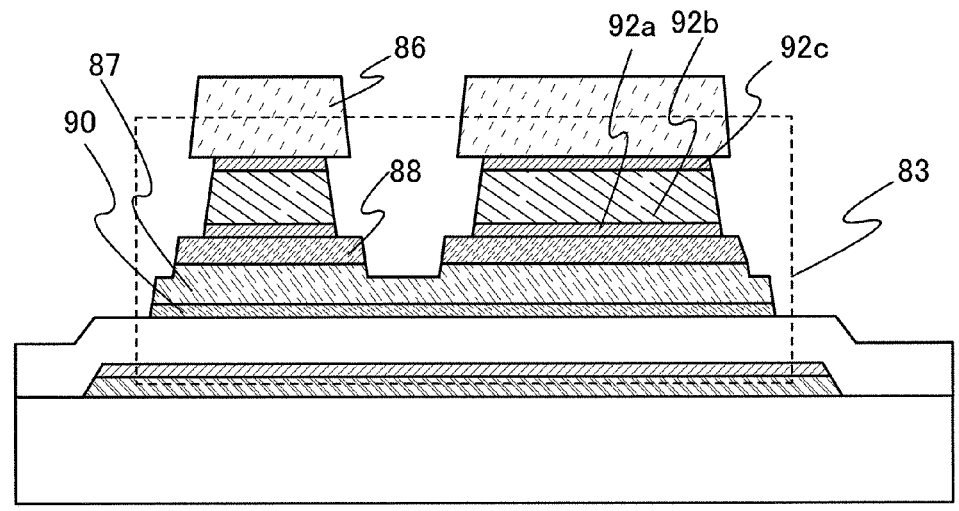
Figure 12A:
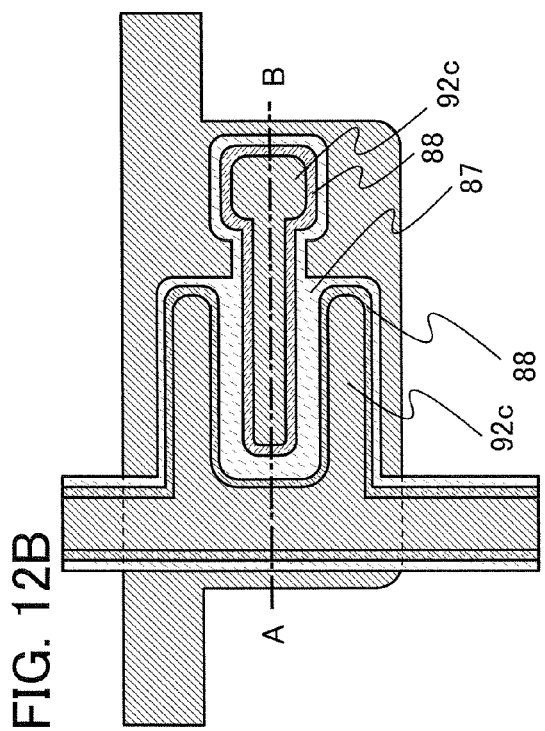
FIGS. 12A to 12C are top views illustrating manufacturing steps of the present invention.
Figure 12B:
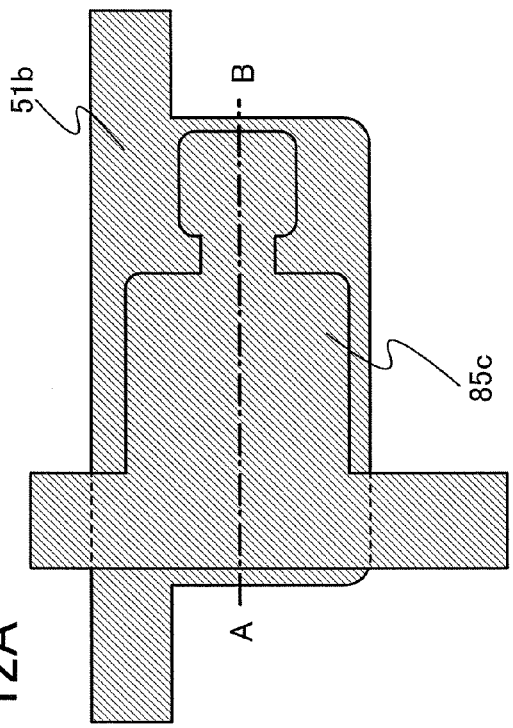
Figure 12C:
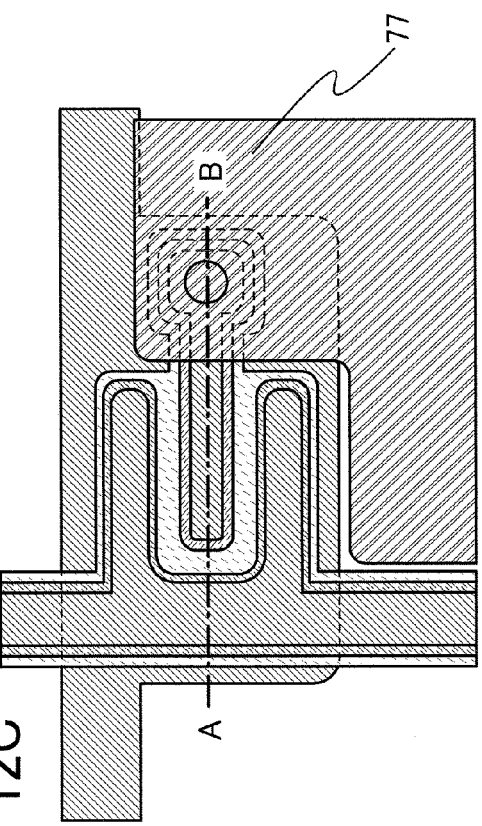

Note that FIG. 10C corresponds to a cross-sectional view taken along A-B in FIG. 12B. As illustrated in FIG. 12B, it can be seen that the end portions of the pair of source and drain regions 88 are located outside the end portions of the source and drain electrodes 92c. In addition, the end portions of the intrinsic amorphous silicon film 87 are located outside the end portions of the source and drain electrodes 92c and the end portions of the pair of source and drain regions 88. Further, one of the source electrode and the drain electrode has a shape of surrounding the other of the source electrode and the drain electrode (specifically a U-shape or a C-shape). Therefore, the area of a region through which carriers transfer can be increased, so that the amount of current can be increased and the area of the thin film transistor can be reduced. Furthermore, unevenness of the gate electrode has little influence because the intrinsic amorphous silicon film and the source and drain electrodes overlap with each other over the gate electrode. Thus, reduction in coverage and generation of leakage current can be suppressed. Note that the one of the source electrode and the drain electrode also functions as a source wiring or a drain wiring.

When the end portions of the source and drain electrodes 92a to 92c and the end portions of the pair of source and drain regions 88 are not aligned with each other as illustrated in FIG. 10C, a distance between the end portions of the source and drain electrodes 92a to 92c is long. Therefore, generation of leakage current between the source electrode and the drain electrode and short circuit can be prevented. Further, since the end portions of the source and drain electrodes 92a to 92c and the end portions of the pair of source and drain regions 88 are not aligned with each other, an electric field does not concentrate on the end portions of the source and the drain electrodes 92a to 92c and the end portions of the source and drain regions 88, and generation of leakage current between the gate electrode 51 and the source and drain electrodes 92a to 92c can be prevented. Therefore, a thin film transistor with high reliability and high withstand voltage can be manufactured.

Through the above-described steps, a channel-etched thin film transistor 83 can be formed. Further, the thin film transistor can be formed by using two photomasks.

Figure 11A:
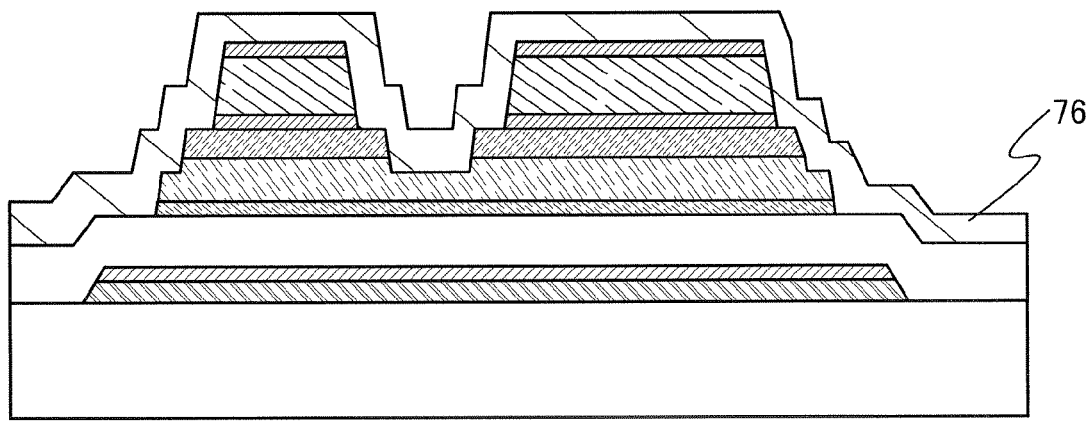
FIGS. 11A and 11B are cross-sectional views illustrating manufacturing steps of the present invention.
Figure 11B:
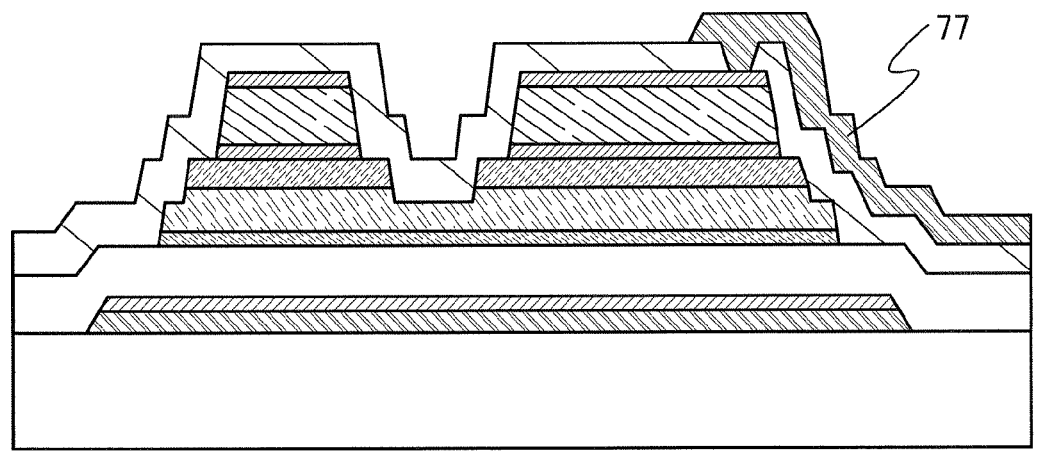

Next, as illustrated in FIG. 11A, the insulating film 76 is formed over the source and drain electrodes 92a to 92c, the pair of source and drain regions 88, the intrinsic amorphous silicon film 87, the amorphous silicon film 90 which is made to have n-type conductivity, and the gate insulating film 52. The insulating film 76 can be formed by using the same manufacturing method as the gate insulating film 52.

Next, a contact hole is formed by partly etching the insulating film 76 by using a resist mask formed using a third photomask. Then, the pixel electrode 77 which is in contact with the source or drain electrode 92c in the contact hole is formed. Here, as the pixel electrode 77, after an indium tin oxide film is deposited by a sputtering method, a resist is applied over the indium tin oxide film. Next, the resist is exposed to light and is developed by using a fourth photomask, so that a resist mask is formed. Then, the indium tin oxide film is etched by using the resist mask to form the pixel electrode 77. Note that FIG. 11B corresponds to a cross-sectional view taken along chain line A-B in FIG. 12C.

Through the above-described steps, the number of masks can be reduced by using the multi-tone mask and an element substrate which can be used for a display device can be formed.

(Embodiment Mode 5)

A method for manufacturing a thin film transistor, in which part of steps is different from that of Embodiment Mode 1, is described with reference to FIGS. 13A to 13C. Here, a step of forming a storage capacitor by using a multi-tone mask and a step of forming a contact between a thin film transistor and a pixel electrode are described. Note that in FIGS. 13A to 13C, portions which are the same as those of Embodiment Mode 1 are denoted by the same reference numerals.

After the steps up to the step of forming the insulating film 76 in accordance with Embodiment Mode 1, a first interlayer insulating film 84a which has openings with different depths is formed by using a multi-tone mask. A cross-sectional view at this stage corresponds to FIG. 13A.

Figure 13A:
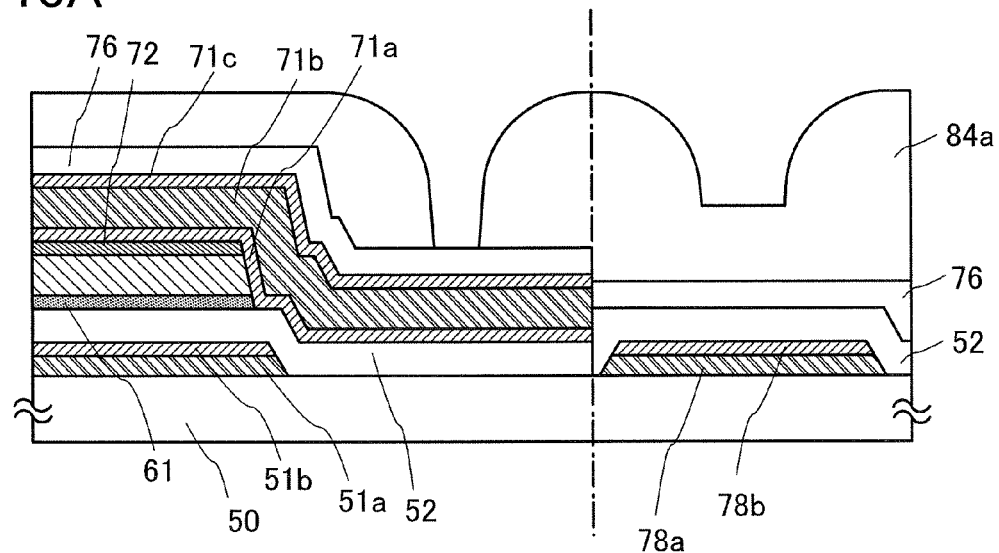
FIGS. 13A to 13C are cross-sectional views illustrating manufacturing steps of the present invention.
Figure 13B:
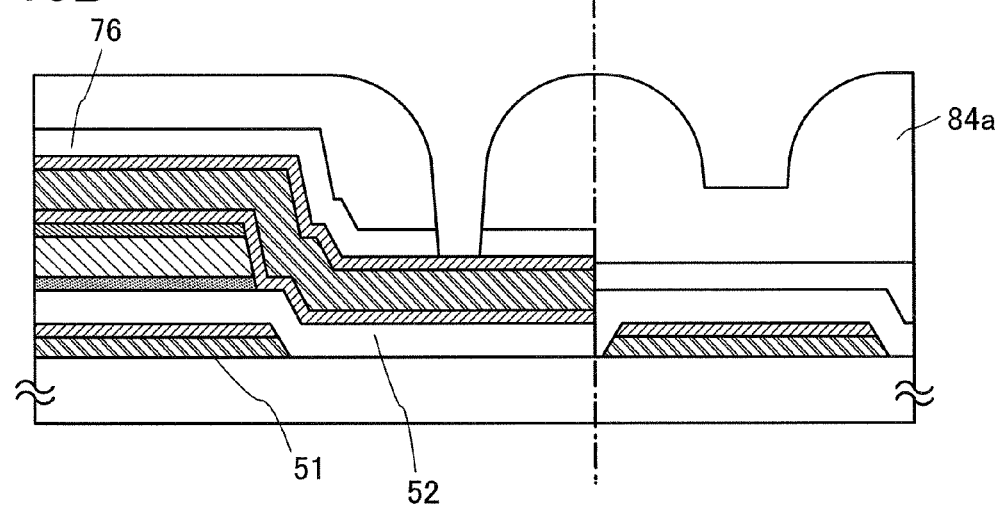
Figure 13C:
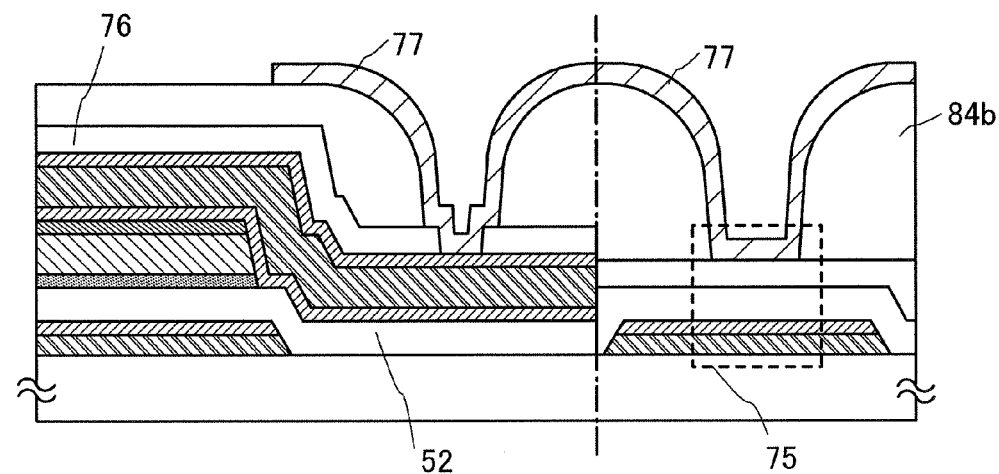

As illustrated in FIG. 13A, a first opening which exposes the surface of the insulating film 76 is provided above the source or drain electrode 71c and a second opening which is at a shallower depth than the first opening is provided over a capacitor wiring formed of a layered structure of a first conductive layer 78a and a second conductive layer 78b. Note that the first conductive layer 78a and the second conductive layer 78b of the capacitor wiring are formed in the same steps as the first conductive layer 51a and the second conductive layer 51b of the gate electrode, respectively.

Subsequently, part of the insulating film 76 is selectively etched by using the first interlayer insulating film 84a as a mask to partly expose the source or drain electrode 71c.

Subsequently, ashing is performed on the first interlayer insulating film 84a until the second opening is enlarged to expose the surface of the insulating film 76. Although the first opening is enlarged at the same time, the size of the opening formed in the insulating film 76 is not changed. Thus, a step is formed.

Subsequently, the pixel electrode 77 is formed. A cross-sectional view at this stage corresponds to FIG. 13C. The first interlayer insulating film is reduced to have the size of a second interlayer insulating film 84b by ashing. Further, as for a storage capacitor 75, the insulating film 76 and the gate insulating film 52 are used as dielectric substances and the capacitor wiring and the pixel electrode 77 are used as a pair of electrodes.

In this manner, the storage capacitor can be formed with a small number of steps by using the multi-tone mask.

This embodiment mode can be freely combined with Embodiment Mode 1.

The present invention, which is formed using the above-described structures, will be described in more detail in embodiments described below.

[Embodiment 1]

In this embodiment, a liquid crystal display device which includes the thin film transistor described in Embodiment Mode 1 is described below as one mode of a display device.

First, a VA (vertical alignment)-mode liquid crystal display device is described. A VA mode of a liquid crystal display device is a kind of mode where alignment of liquid crystal molecules of a liquid crystal panel is controlled. A VA mode is a mode in which liquid crystal molecules are aligned vertically to a panel surface when voltage is not applied. In particular, in this embodiment, it is devised that a pixel is divided into several regions (subpixels) so that molecules are aligned in different directions. This is referred to as domain multiplication or multi-domain. In the following description, a multi-domain liquid crystal display device is described.

Figure 14:
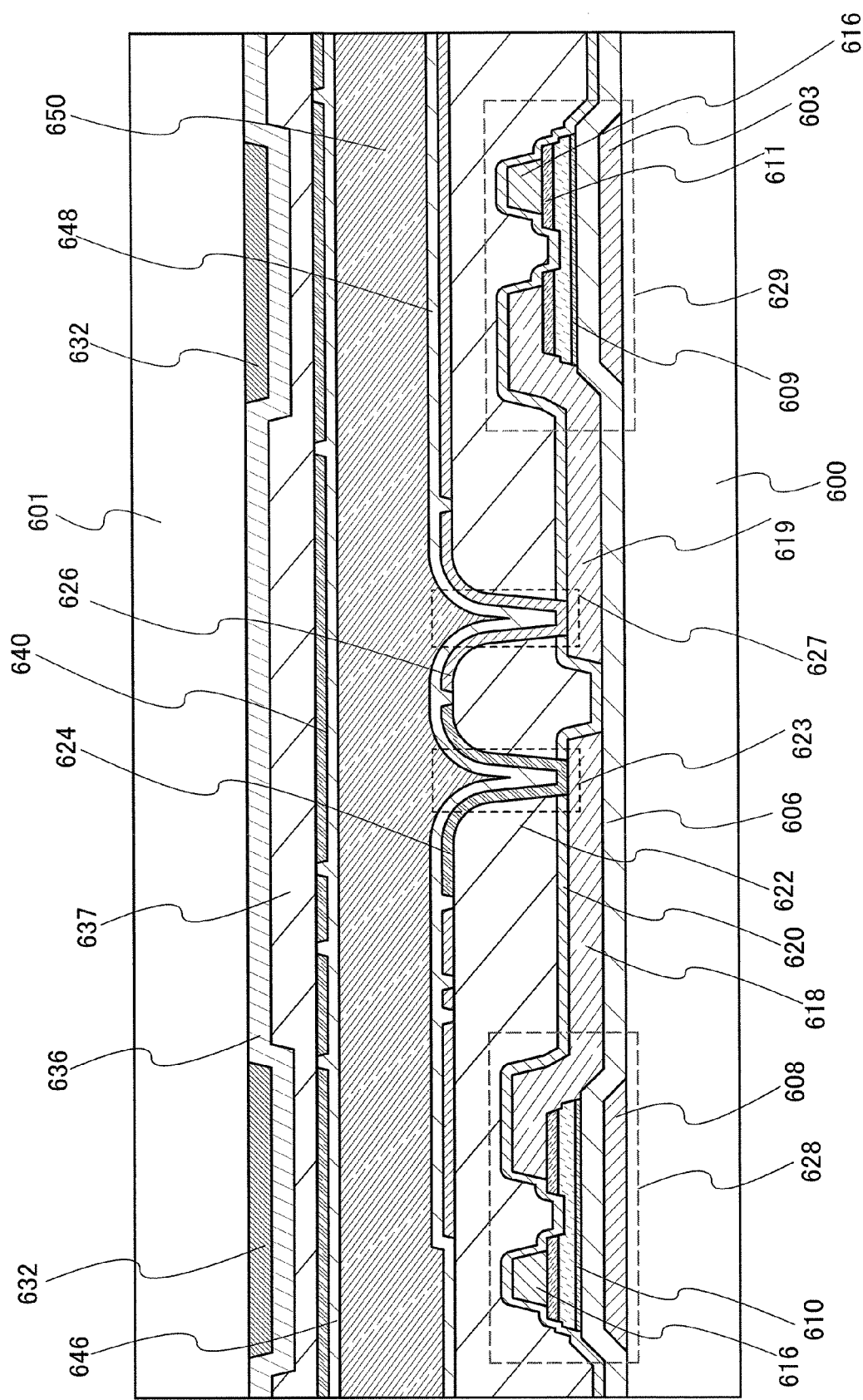
FIG. 14 is a cross-sectional view illustrating a liquid crystal display device of the present invention.
Figure 15:
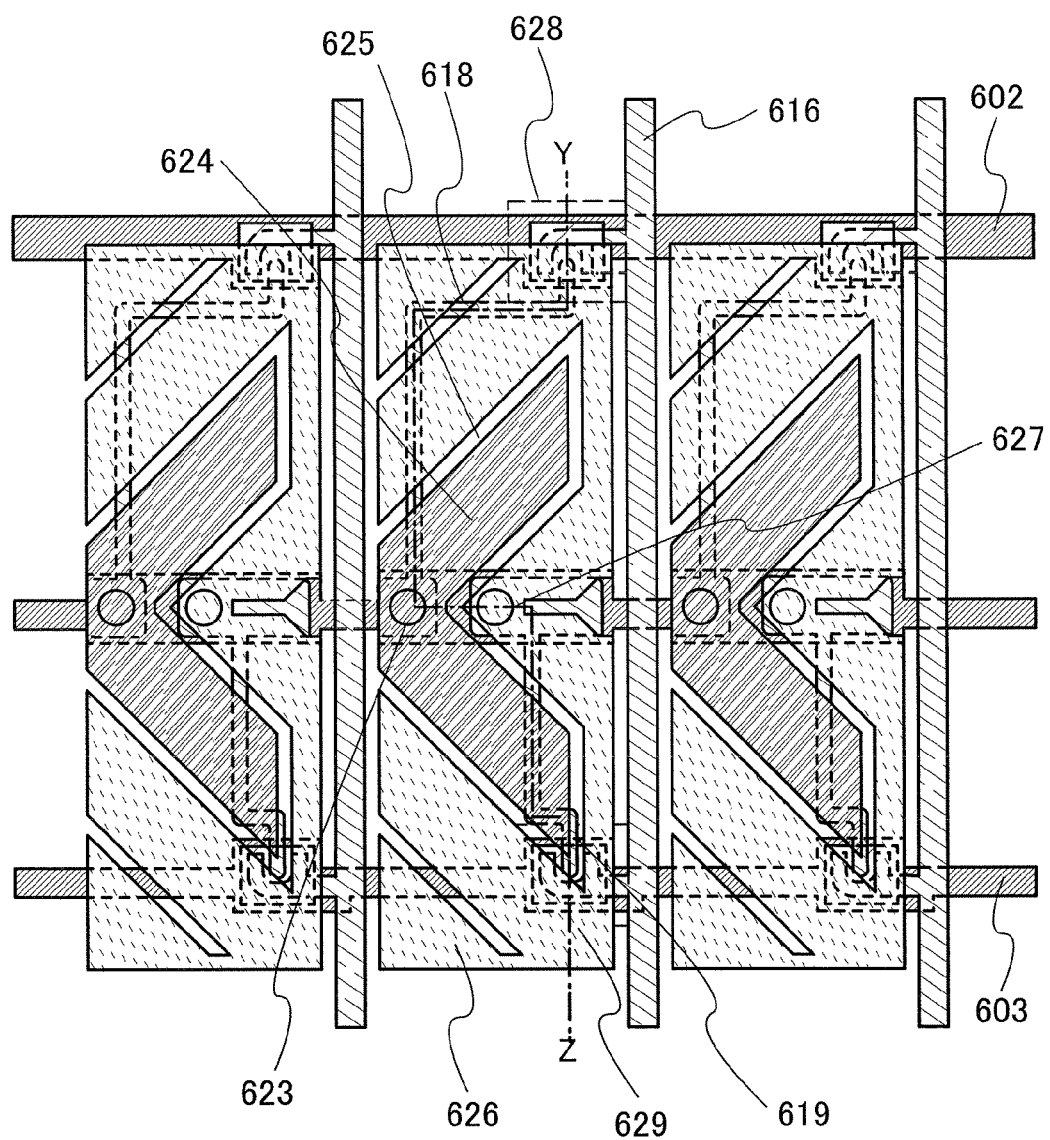
FIG. 15 is a top view illustrating the liquid crystal display device of the present invention.

FIGS. 14 and 15 each illustrate the pixel structure of a VA-mode liquid crystal display device. FIG. 15 is a plan view of a substrate 600. FIG. 14 illustrates a cross-sectional structure taken along line Y-Z in FIG. 15. Hereinafter, description is made with reference to these drawings.

In this pixel structure, one pixel includes a plurality of pixel electrodes and a thin film transistor is connected to each of the plurality of pixel electrodes. The thin film transistors are driven by different gate signals. That is, in the multi-domain pixel, signals supplied to the respective pixel electrodes can be controlled separately.

A first pixel electrode 624 is connected to a TFT 628 by a wiring 618 through a contact hole 623. In addition, a second pixel electrode 626 is connected to a TFT 629 by a wiring 619 through a contact hole 627. A gate wiring 602 of the TFT 628 and a gate wiring 603 of the TFT 629 are separated from each other so that different gate signals can be supplied. On the other hand, a wiring 616 which functions as a data line is shared between the TFT 628 and the TFT 629. As each of the TFT 628 and the TFT 629, the thin film transistor described in Embodiment Mode 1 can be used as appropriate.

The TFT 628 is an inverted-staggered TFT, and an n$^-$-type layer 610 is formed between a gate insulating film 606 and an intrinsic amorphous semiconductor layer above a gate wiring 608. In addition, also in the TFT 629, an n$^-$-type layer 609 is formed between the gate insulating film 606 and the intrinsic amorphous semiconductor layer. An n$^+$-type layer 611 is provided between the wiring 616 and the intrinsic amorphous semiconductor layer.

Figure 17:
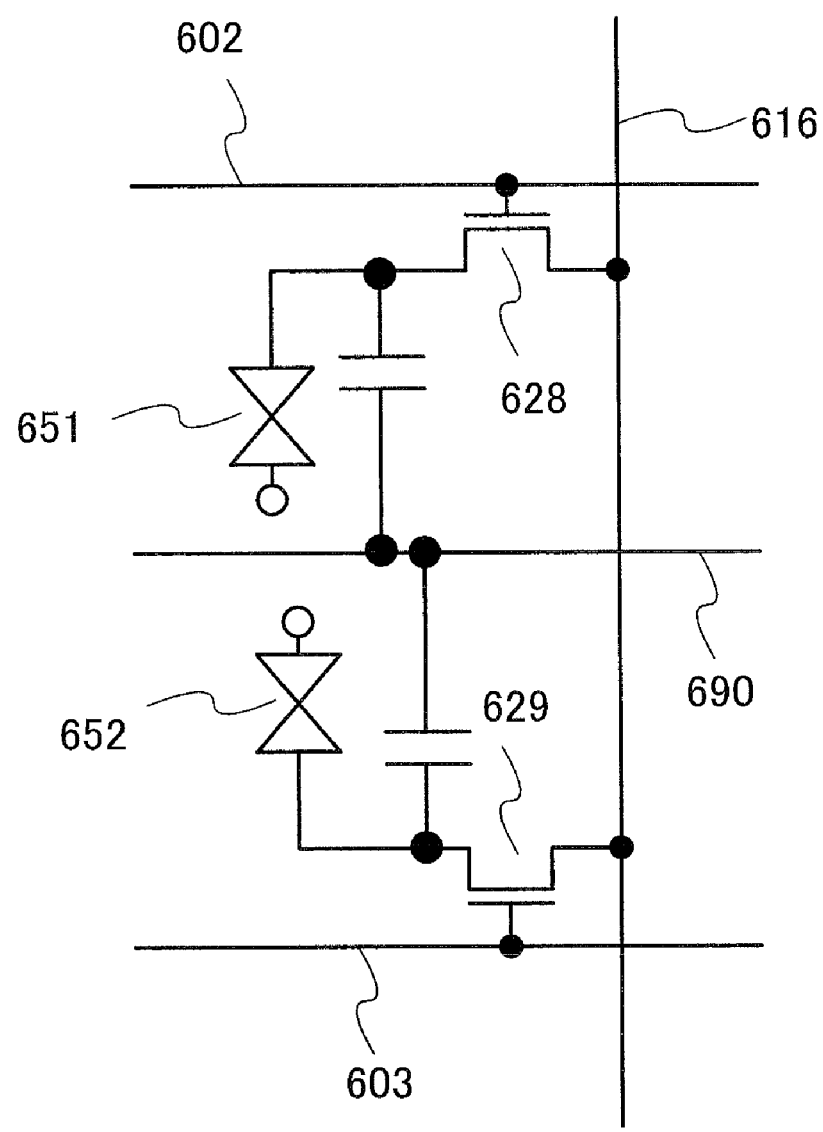
FIG. 17 is a circuit diagram illustrating the liquid crystal display device of the present invention.

The first pixel electrode 624 and the second pixel electrode 626 have different shapes and are separated by a slit 625. The second pixel electrode 626 is provided so as to surround the external side of the first pixel electrode 624 which is spread in a V shape. Timings of voltage application are varied between the first pixel electrode 624 and the second pixel electrode 626 by the TFT 628 and the TFT 629, so that alignment of liquid crystals is controlled. FIG. 17 illustrates an equivalent circuit of this pixel structure. The TFT 628 is connected to the gate wiring 602. The TFT 629 is connected to the gate wiring 603. By supplying different gate signals to the gate wiring 602 and the gate wiring 603, operation timings of the TFT 628 and the TFT 629 can be varied.

Figure 16:
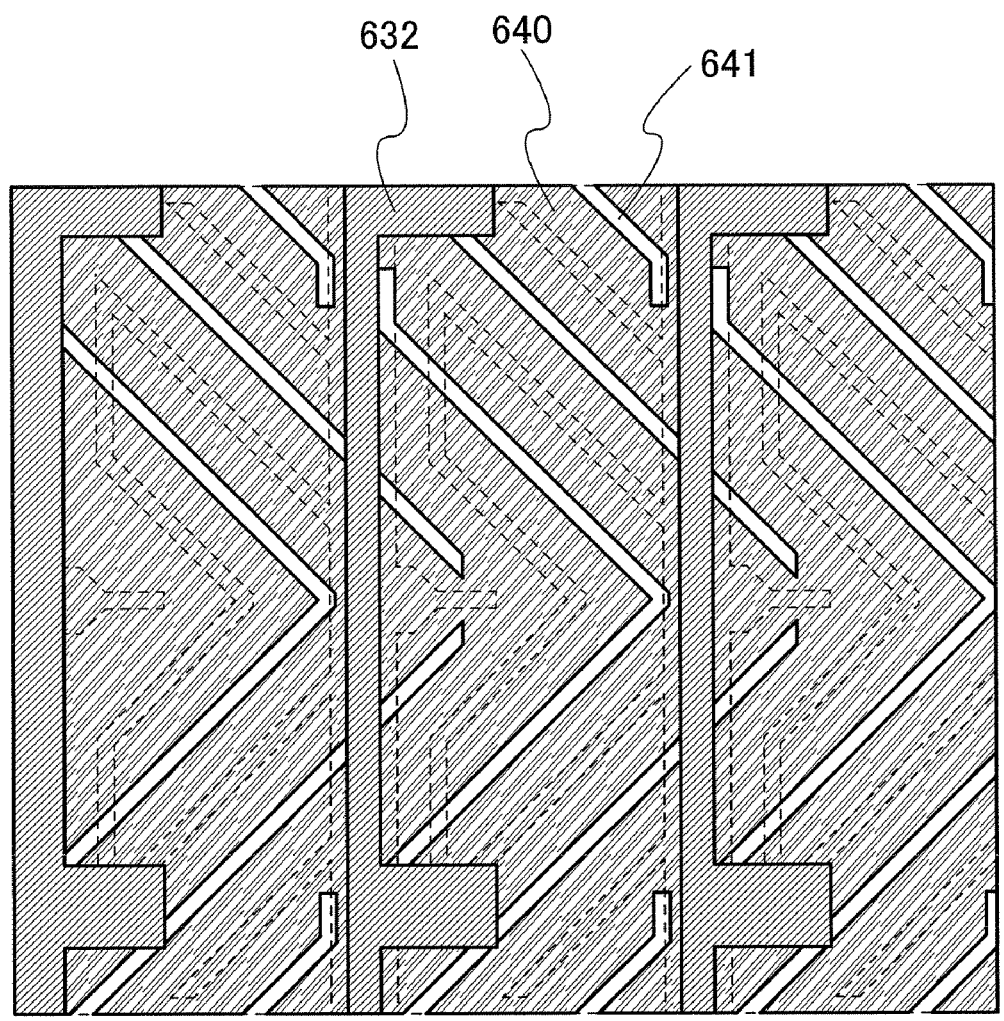
FIG. 16 is a top view illustrating the liquid crystal display device of the present invention.

A light-shielding film 632, a colored film 636, and a counter electrode 640 are provided on a counter substrate 601. In addition, a planarization film 637 is formed between the colored film 636 and the counter electrode 640 and prevents alignment disorder of the liquid crystals. FIG. 16 illustrates the structure of the counter substrate side. The counter electrode 640 is shared between different pixels and has a slit 641. By providing the slit 641 and the slit 625 on the first and second pixel electrodes 624 and 626 side so as alternately engage with each other, an oblique electric field is effectively generated, so that alignment of the liquid crystals can be controlled. Therefore, directions of alignment of the liquid crystals can be varied depending on location, and the viewing angle is increased.

A first liquid crystal element is formed by overlapping of the first pixel electrode 624, a liquid crystal layer 650, and the counter electrode 640. In addition, a second liquid crystal element is formed by overlapping of the second pixel electrode 626, the liquid crystal layer 650, and the counter electrode 640. Therefore, a multi-domain structure where the first liquid crystal element and the second liquid crystal element are provided in one pixel is formed.

The present invention is not limited to a VA-mode liquid crystal display device. The thin film transistor described in Embodiment Mode 1 can be used as a switching element of a horizontal electric field-mode liquid crystal display device or a TN-mode liquid crystal display device. Note that a horizontal electric field-mode is a mode where liquid crystals are driven to express grayscale by horizontally applying an electric field to liquid crystal molecules in a cell. According to this mode, the viewing angle can be increased to approximately 180 degrees.

This embodiment can be freely combined with any one of Embodiment Modes 1 to 4.

[Embodiment 2]

In this embodiment mode, a light-emitting device which is one mode of a display device is described with reference to FIGS. 18A and 18B and FIGS. 19A to 19C. Here, a light-emitting element utilizing electroluminescence is used for a light-emitting device. Light-emitting elements utilizing electroluminescence are classified according to whether a light-emitting material is an organic compound or an inorganic compound. In general, the former is referred to as an organic EL element and the latter is referred to as an inorganic EL element.

In an organic EL element, when voltage is applied to a light-emitting element, electrons and holes are injected from a pair of electrodes into a layer containing a light-emitting organic compound, and current flows. Then, these carriers (the electrons and holes) are recombined, so that the light-emitting organic compound is set in an excited state. The light-emitting emits light when it returns from the excited state to a ground state. Because of such a mechanism, such a light-emitting element is referred to as a current-excitation light-emitting element.

Inorganic EL elements are classified into a dispersion type inorganic EL element and a thin-film type inorganic EL element depending on their element structures. A dispersion type inorganic EL element has a light-emitting layer where particles of a light-emitting material are dispersed in a binder, and its light emission mechanism is donor-acceptor recombination type light emission which utilizes a donor level and an acceptor level. A thin-film type inorganic EL element has a structure where a light-emitting layer is interposed between dielectric layers, which are further interposed between electrodes, and its light emission mechanism is localized type light emission which utilizes inner-shell electron transition of metal ions. Note that here, an organic EL element is used as a light-emitting element. In addition, a channel-etched thin film transistor is used as a thin film transistor which controls driving of a light-emitting element.

Through the process of FIGS. 9A and 9B, FIGS. 10A to 10C, and FIGS. 11A and 11B, a thin film transistor 83 is formed in a pixel portion 122 over the substrate 50, a thin film transistor 79 is formed in a driver circuit 121, and an insulating film 87 which functions as a protective film is formed over the thin film transistors 83 and 79, as illustrated in FIG. 18A. Next, a planarization film 111 is formed over the insulating film 87, and a pixel electrode 112 which is connected to a source or drain electrode of the thin film transistor 83 is formed over the planarization film 111.

The planarization film 111 is preferably formed using an organic resin such as acrylic, polyimide, or polyamide, or siloxane.

Since the thin film transistor of a pixel is an n-channel transistor, it is preferable to use a cathode as the pixel electrode 112. On the other hand, in the case where the thin film transistor is a p-channel transistor, it is preferable to use an anode as the pixel electrode 112. Specifically, as a cathode, a known material with low work function, such as calcium, aluminum, calcium fluoride, a magnesium silver alloy, or a lithium aluminum alloy can be used.

Next, as illustrated in FIG. 18B, a partition 113 is formed over the planarization film 111 and the end portion of the pixel electrode 112. The partition 113 has an opening portion and the pixel electrode 112 is exposed through the opening portion. The partition 113 is formed using an organic resin film, an inorganic insulating material, or organic polysiloxane. It is particularly preferable that the partition 113 be formed using a photosensitive material to have an opening portion over the pixel electrode so that the sidewall of the opening portion is formed as a tilted surface with continuous curvature.

Next, a light-emitting layer 114 is formed so as to be in contact with the pixel electrode 112 through the opening portion of the partition 113. The light-emitting layer 114 may be formed using either a single-layer structure or a layered structure of a plurality of layers.

Then, a common electrode 115 using an anode is formed so as to cover the light-emitting layer 114. The common electrode 115 can be formed of a light-transmitting conductive film using any of the light-transmitting conductive materials described in Embodiment Mode 1 for the pixel electrode 77.

Instead of the light-transmitting conductive film, a titanium nitride film or a titanium film may be used as the common electrode 115. In FIG. 18B, indium tin oxide is used for the common electrode 115. In the opening portion of the partition 113, a light-emitting element 117 is formed by overlapping of the pixel electrode 112, the light-emitting layer 114, and the common electrode 115. After that, it is preferable to form a protective film 116 over the common electrode 115 and the partition 113 so that oxygen, hydrogen, moisture, carbon dioxide, or the like does not enter the light-emitting element 117. As the protective film 116, a silicon nitride film, a silicon nitride oxide film, a DLC film, or the like can be formed.

In practice, after the steps to FIG. 18B are completed, it is preferable that packaging (encapsulation) be performed using a protective film (a laminate film, an ultraviolet curable resin film, or the like) or a cover material, which has high airtightness and causes less degassing so as to prevent exposure to the air.

Next, structures of light-emitting elements are described with reference to FIGS. 19A to 19C. Here, the case where a driving transistor is an n-channel transistor is illustrated, and cross-sectional structures of pixels are described.

In a light-emitting element, it is acceptable as long as at least one of an anode and a cathode is transparent in order to extract light emission. There are light-emitting elements having the following structures: a top emission structure where a thin film transistor and a light-emitting element are formed over a substrate and light is extracted from a side opposite to the substrate; a bottom emission structure where light is extracted from the substrate side; and a dual emission structure where light is extracted from both the substrate side and the side opposite to the substrate. The present invention can be applied to a light-emitting element with any of the emission structures.

A light-emitting element having a top emission structure is described with reference to FIG. 19A.

Figure 19A:
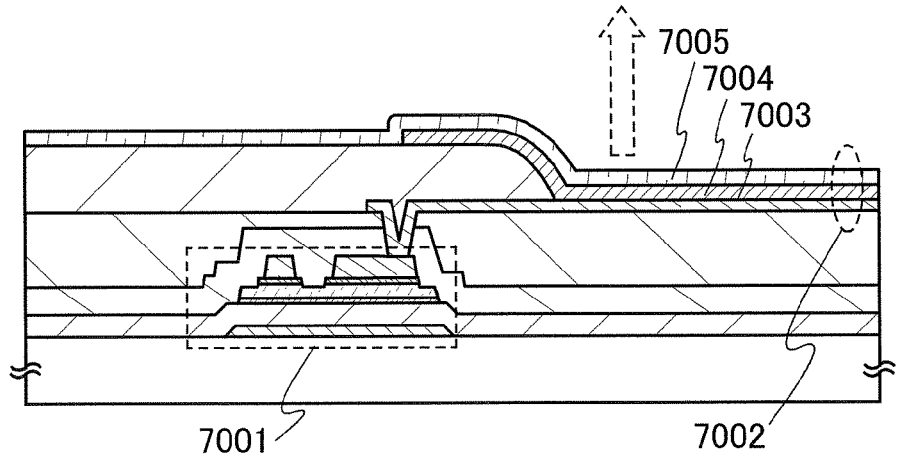
FIGS. 19A to 19C are cross-sectional views each illustrating a pixel which can be used for the light-emitting device of the present invention.

FIG. 19A is a cross-sectional view of a pixel in the case where a driving TFT 7001 is an n-channel transistor and light is emitted from a light-emitting element 7002 to an anode 7005 side. In FIG. 19A, a cathode 7003 of a light-emitting element 7002 is electrically connected to the driving TFT 7001, and a light-emitting layer 7004 and the anode 7005 are sequentially stacked over the cathode 7003. The cathode 7003 can be formed using any known conductive film as long as it has a low work function and reflects light. For example, calcium, aluminum, calcium fluoride, a silver magnesium alloy, a lithium aluminum alloy, or the like is preferable. The light-emitting layer 7004 may be formed using either a single-layer structure or a layered structure of a plurality of layers. In the case of using a plurality of layers, an electron injection layer, an electron transport layer, a light-emitting layer, a hole transport layer, and a hole injection layer are stacked in that order over the cathode 7003. Note that all these layers are not necessarily provided. The anode 7005 is formed using a light-transmitting conductive material which transmits light, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like may be used.

A region where the light-emitting layer 7004 is interposed between the cathode 7003 and the anode 7005 corresponds to the light-emitting element 7002. In the case of the pixel illustrated in FIG. 19A, light is emitted from the light-emitting element 7002 to the anode 7005 side, as indicated by an outlined arrow.

A light-emitting element having a bottom emission structure is described with reference to FIG. 19B. FIG. 19B is a cross-sectional view of a pixel in the case where a driving TFT 7001 is an n-channel transistor and light is emitted from a light-emitting element 7012 to a cathode 7013 side. In FIG. 19B, the cathode 7013 of the light-emitting element 7012 is deposited over a light-transmitting conductive material 7017 which is electrically connected to the driving TFT 7011, and a light-emitting layer 7014 and an anode 7015 are sequentially stacked over the cathode 7013. Note that in the case where the anode 7015 has light-transmitting properties, a shielding film for reflecting or shielding light may be deposited so as to cover the anode. In a manner similar to that of FIG. 19A, the cathode 7013 can be formed using any known conductive film as long as it has a low work function. Note that the thickness is set so that light is transmitted therethrough (preferably about 5 to 30 nm). For example, an aluminum film having a thickness of 20 nm can be used as the cathode 7013. In a manner similar to that of FIG. 19A, the light-emitting layer 7014 may be formed using either a single-layer structure or a layered structure of a plurality of layers. Although the anode 7015 does not need to transmit light, the anode 7015 can be formed using a light-transmitting conductive material in a manner similar to that of FIG. 19A. The shielding film can be formed using, for example, a metal film which reflects light, or the like. However, the shielding film is not limited to a metal film. For example, a resin to which a black pigment is added can be used.

A region where the light-emitting layer 7014 is interposed between the cathode 7013 and the anode 7015 corresponds to the light-emitting element 7012. In the case of the pixel illustrated in FIG. 19B, light is emitted from the light-emitting element 7012 to the cathode 7013 side as indicated by an outlined arrow.

Next, a light-emitting element having a dual emission structure is described with reference to FIG. 19C. In FIG. 19C, a cathode 7023 of a light-emitting element 7022 is deposited over a light-transmitting conductive material 7027 which is electrically connected to a driving TFT 7021, and a light-emitting layer 7024 and an anode 7025 are sequentially stacked over the cathode 7023. In a manner similar to that of FIG. 19A, the cathode 7023 can be formed using any known conductive film as long as it has a low work function. Note that the thickness is set so that light is transmitted therethrough. For example, an aluminum film having a thickness of 20 nm can be used as the cathode 7023. In a manner similar to that of FIG. 19A, the light-emitting layer 7024 may be formed using either a single-layer structure or a layered structure of a plurality of layers. In a manner similar to that of FIG. 19A, the anode 7025 can be formed using a light-transmitting conductive material.

A region where the cathode 7023, the light-emitting layer 7024, and the anode 7025 overlap with each other corresponds to the light-emitting element 7022. In the case of the pixel illustrated in FIG. 19C, light is emitted from the light-emitting element 7022 to both the anode 7025 side and the cathode 7023 side as indicated by outlined arrows.

Note that although an organic EL element is described here as a light-emitting element, an inorganic EL element can also be used as a light-emitting element.

Note that although the example in which a thin film transistor (a driving TFT) which controls driving of a light-emitting element is electrically connected to the light-emitting element is described in this embodiment mode, a transistor for controlling current may be connected between the driving TFT and the light-emitting element.

Figure 19B:
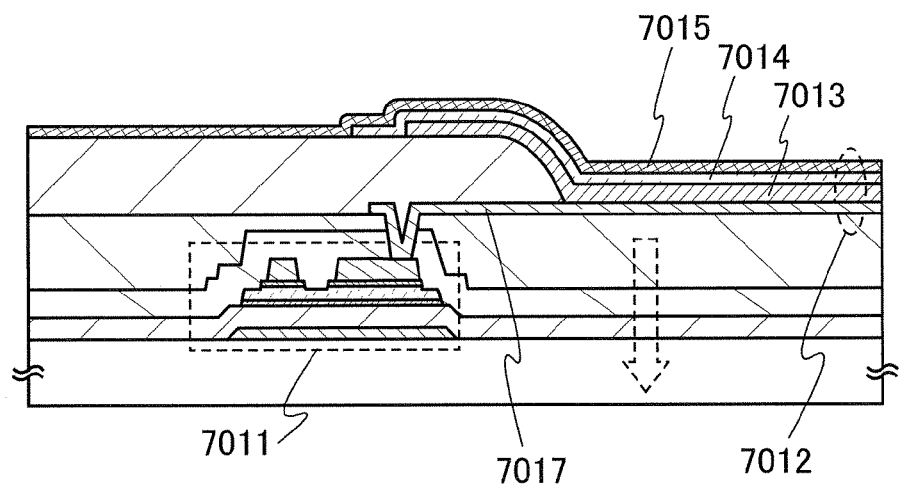
Figure 19C:
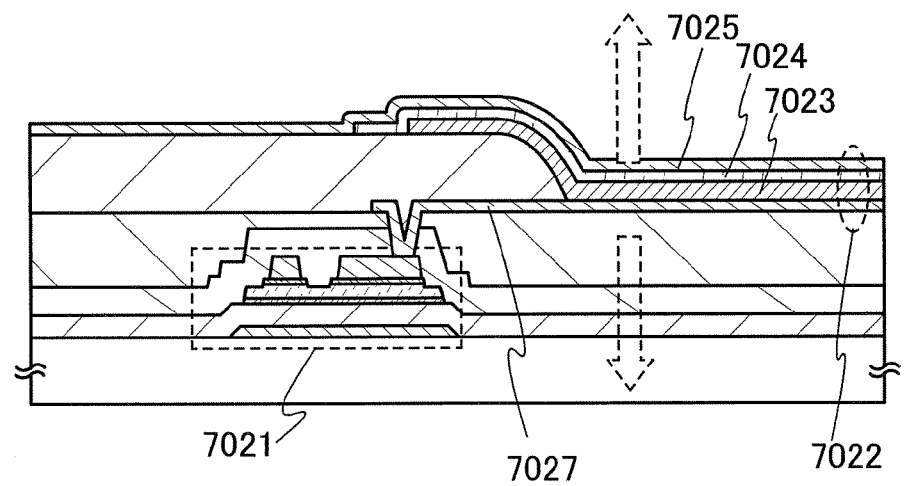

Note that the light-emitting device described in this embodiment mode is not limited to the structures shown in FIGS. 19A to 19C, and can be modified in various ways based on the technical idea of the present invention.

Through the above-described steps, the light-emitting device can be manufactured.

This embodiment can be freely combined with any one of Embodiment Modes 1 to 4.

[Embodiment 3]

The structure of a display panel, which is one mode of a display device of the present invention, is described below.

Figure 20A:
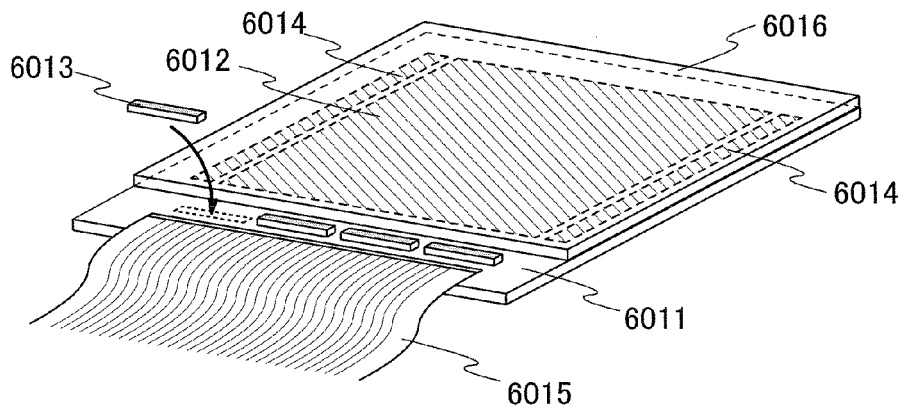
FIGS. 20A to 20C are perspective views each illustrating a display panel of the present invention.

FIG. 20A illustrates a mode of a display panel where a signal line driver circuit 6013 and part of a scan line driver circuit are separately formed and are connected to a pixel portion 6012 formed over a substrate 6011. The pixel portion 6012 and part of a scan line driver circuit 6014 are each formed using a thin film transistor which has an n⁻type layer. In addition, in order to improve reliability, a protection circuit is also formed over the substrate 6011. Note that the part of the scan line driver circuit and the signal line driver circuit 6013 may be formed using a thin film transistor using a single crystal semiconductor, a thin film transistor using a polycrystalline semiconductor, or a thin film transistor using an SOI. The pixel portion 6012, the signal line driver circuit 6013, and the part of the scan line driver circuit 6014 are each supplied with a potential of a power source, various signals, and the like through an FPC 6015.

Figure 20B:
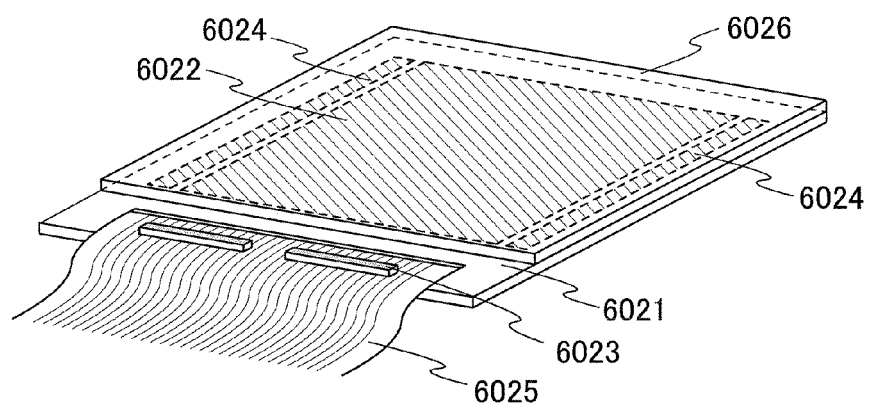

In addition, when driver circuits are separately formed, a substrate provided with the driver circuit is not necessarily to be attached to a substrate provided with the pixel portion, and may be attached to, for example, the FPC. FIG. 20B illustrates a mode of a panel of a liquid crystal display device, where a signal line driver circuit 6023 and part of a scan line driver circuit are separately formed and are connected to a pixel portion 6022 and part of a scan line driver circuit 6024 which are formed over a substrate 6021. The pixel portion 6022 and the part of the scan line driver circuit 6024 are each formed using a thin film transistor which has an n⁻type layer. The signal line driver circuit 6023 is connected to the pixel portion 6022 through an FPC 6025. The pixel portion 6022, the signal line driver circuit 6023, and the part of the scan line driver circuit 6024 are each supplied with potential of a power source, a variety of signals, and the like through the FPC 6025.

Figure 20C:
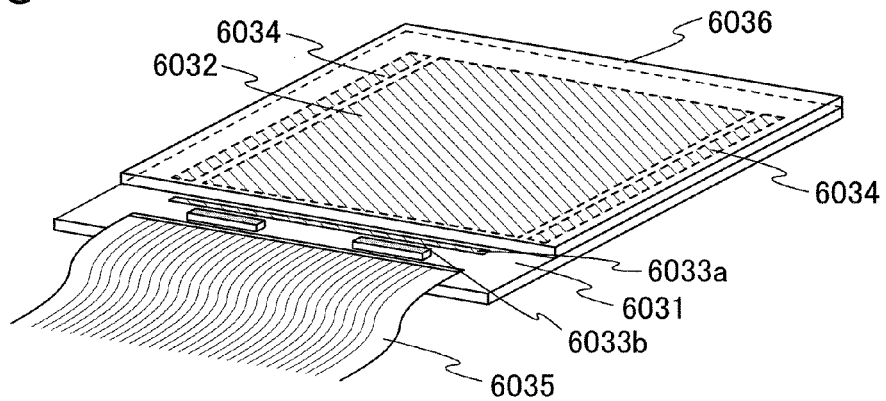

Alternatively, only part of the signal line driver circuit or part of the scan line driver circuit may be formed over the same substrate as the pixel portion by using a thin film transistor which has an n⁻type layer, and the other part of the driver circuit may be separately formed and electrically connected to the pixel portion. FIG. 20C illustrates a mode of a liquid crystal display panel, where an analog switch 6033a which is part of the signal driver circuit is formed over a substrate 6031 over which a pixel portion 6032 and part of a scan line driver circuit 6034 are formed, and a shift register 6033b which is part of the signal line driver circuit is formed separately over a different substrate and then attached to the substrate 6031. The pixel portion 6032 and the part of the scan line driver circuit 6034 are each formed using a thin film transistor which has an n⁻type layer. The shift register 6033b which is part of the signal line driver circuit is connected to the pixel portion 6032 through an FPC 6035. The pixel portion 6032, the signal line driver circuit, and the part of the scan line driver circuit 6034 are each supplied with potential of a power source, a variety of signals, and the like through the FPC 6035.

Note that a connection method of the substrate which is separately formed is not particularly limited to a certain method, and a known COG method, wire bonding method, TAB method, or the like can be used. Further, a connection position is not limited to the position illustrated in FIG. 20C as long as electric connection is possible. Moreover, a controller, a CPU, a memory, or the like may be formed separately and connected.

Note that the signal line driver circuit is not limited to having a structure including only a shift register and an analog switch. In addition to the shift register and the analog switch, another circuit such as a buffer, a level shifter, or a source follower may be included. Further, the shift register and the analog switch are not necessarily provided. For example, another circuit such as a decoder circuit by which a signal line can be selected may be used instead of the shift register, or a latch or the like may be used instead of the analog switch.

Note that as a material of each of the counter substrates 6016, 6026, and 6036, glass, metal (typically stainless steel), ceramics, plastics, or the like can be used. As plastics, an FRP (fiberglass-reinforced plastics) plate, a PVF (polyvinyl fluoride) film, a polyester film, or an acrylic resin film can be used. Alternatively, a sheet in which aluminum foil is interposed between PVF films or polyester films can be used.

In the case of a liquid crystal display device, a liquid crystal material is filled between a pair of substrates by using a sealant and a space between the pair of substrates is held by a spherical spacer or a columnar spacer. In addition, an alignment film or a polarizing plate may be provided as appropriate and a color filter or a light-shielding film may be additionally provided.

Alternatively, in the case of a light-emitting display device, a sealant may be provided to seal between a pair of substrates or a resin may be filled between the pair of substrates so that oxygen or moisture does not enter the pair of substrates, and a desiccant may be additionally provided between the pair of substrates. In addition, an optical film such as a polarizing plate, a circular polarizing plate (including an oval polarizing plate), a retardation plate (a $\lambda/4$ plate or a $\lambda/2$ plate), or a color filter may be provided as appropriate over a light-emitting surface of a light-emitting element. Further, an anti-reflection film may be provided over a polarizing plate or a circular polarizing plate. For example, anti-glare treatment can be performed by which reflected light can be diffused by unevenness of a surface and reflection can be reduced.

This embodiment can be freely combined with any one of Embodiment Modes 1 to 4, Embodiment 1, and Embodiment 2.

[Embodiment 4]

A display device or the like obtained by using the present invention can be used for an active matrix display device module. That is, the present invention can be applied to any of electronic devices in which such an active matrix display device module is incorporated in a display portion.

Examples of such electronic devices are cameras such as a video camera and a digital camera, a head-mounted display (a goggle-type display), a car navigation system, a projector, a car stereo, a personal computer, a portable information terminal (e.g., a mobile computer, a cell phone, or an electronic book), and the like. FIGS. 21A to 21D illustrate examples of such electronic devices.

Figure 21A:
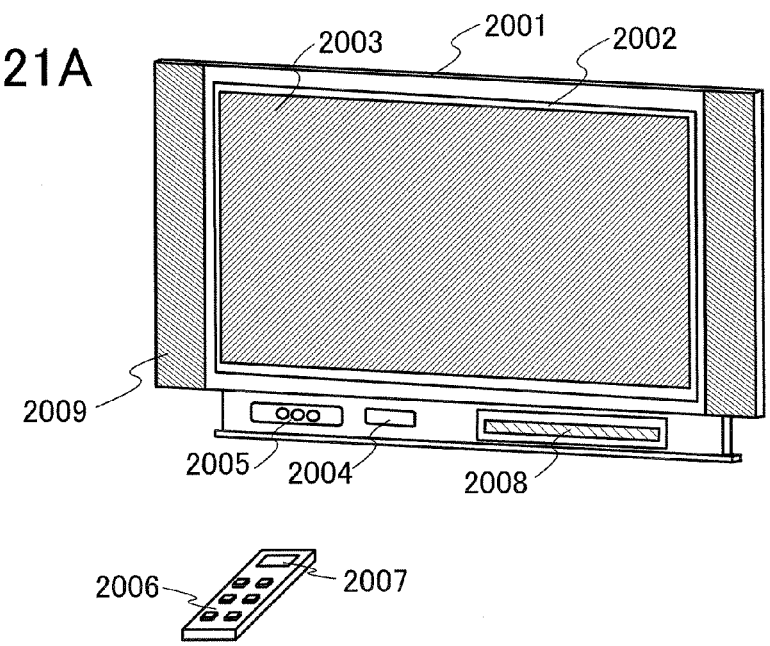
FIGS. 21A to 21D are perspective views each illustrating an electronic device using a display device of the present invention.

FIG. 21A illustrates a television set. A television set can be completed when a display module is incorporated in a housing, as shown in FIG. 21A. A display panel on which an FPC is mounted is also referred to as a display module. A main screen 2003 is formed using the display module, and a speaker portion 2009, operation switches, and the like are provided as its accessory equipment. Thus, the television set can be completed.

As illustrated in FIG. 21A, a display panel 2002 using a display element is incorporated in a housing 2001. When a receiver 2005 is used, including reception of general TV broadcast, communication of information can also be performed in one way (from a transmitter to a receiver) or in two ways (between a transmitter and a receiver or between receivers) by connection to a wired or wireless communication network through a modem 2004. The television set can be operated by switches incorporated in the housing or by a remote controller 2006 separated from the main body. A display portion 2007 displaying information to be output may also be provided in this remote controller 2006.

In addition, for the television set, a structure for displaying a channel, sound volume, or the like may be added by forming a subscreen 2008 with a second display panel in addition to the main screen 2003. In this structure, the main screen 2003 may be formed using a liquid crystal display panel superior in the viewing angle, and the subscreen may be formed using a light-emitting display panel capable of displaying images with low power consumption. Alternatively, in order to prioritize low power consumption, a structure may be used in which the main screen 2003 is formed using a light-emitting display panel, the subscreen is formed using a liquid crystal display panel, and the subscreen can flash on and off.

Needless to say, the present invention is not limited to the television set, and can be applied to various uses particularly as a large display medium such as an information display board at a train station, an airport, or the like, or an advertisement display board on the street, as well as a monitor of a personal computer.

Figure 21B:
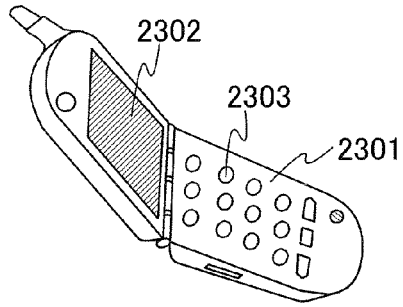

FIG. 21B illustrates an example of a mobile phone 2301. The mobile phone 2301 includes a display portion 2302, an operation portion 2303, and the like. By applying the display device described in any of the aforementioned embodiments to the display portion 2302, mass productivity can be improved.

Figure 21C:
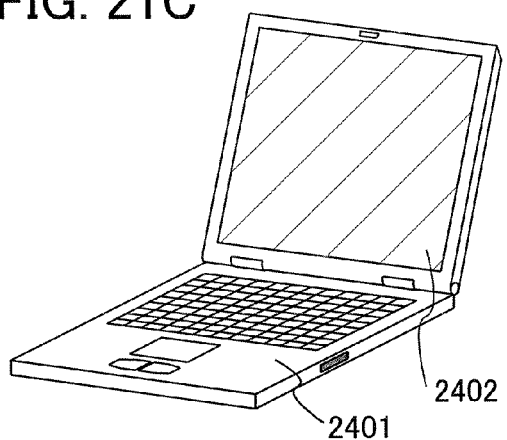

A mobile computer illustrated in FIG. 21C includes a main body 2401, a display portion 2402, and the like. By applying the display device described in any of the aforementioned embodiments to the display portion 2402, mass productivity can be improved.

Figure 21D:
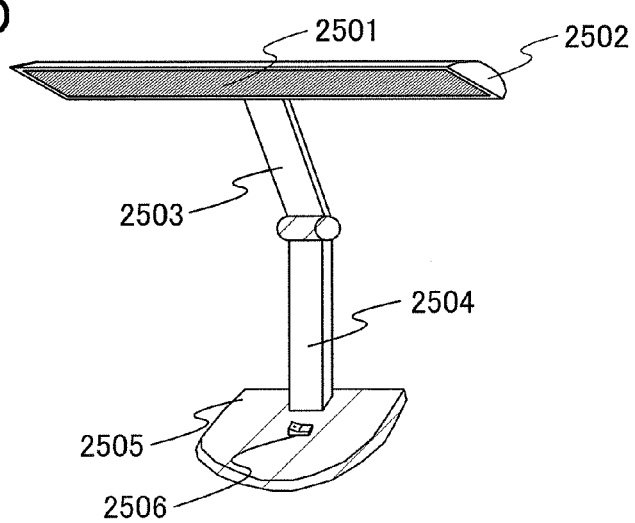

FIG. 21D illustrates a desk lighting appliance, which includes a lighting portion 2501, a shade 2502, an adjustable arm 2503, a support 2504, a base 2505, and a power supply 2506. The desk lighting appliance is manufactured by using a light-emitting device for the lighting portion 2501. Note that a lighting appliance also refers to a ceiling lighting appliance, a wall-hanging appliance, and the like. When the display device described in any of the aforementioned embodiments is used, mass productivity can be improved and an inexpensive desk lighting appliance can be provided.

This embodiment can be freely combined with any one of Embodiment Modes 1 to 4, Embodiment 1, Embodiment 2, and Embodiment 3.

[Embodiment 5]

Figure 6A:
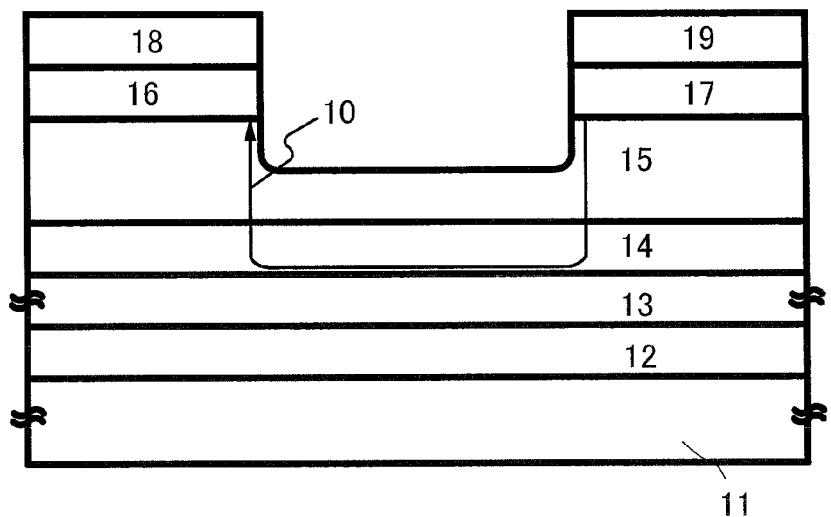
FIG. 6A is a model cross-sectional view.
Figure 6B:
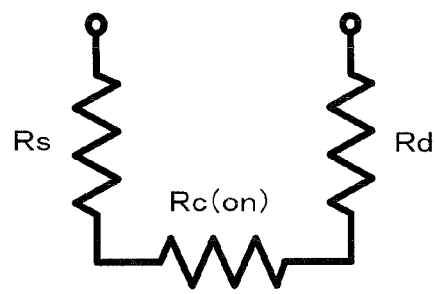
FIG. 6B is an equivalent circuit diagram.
Figure 6C:
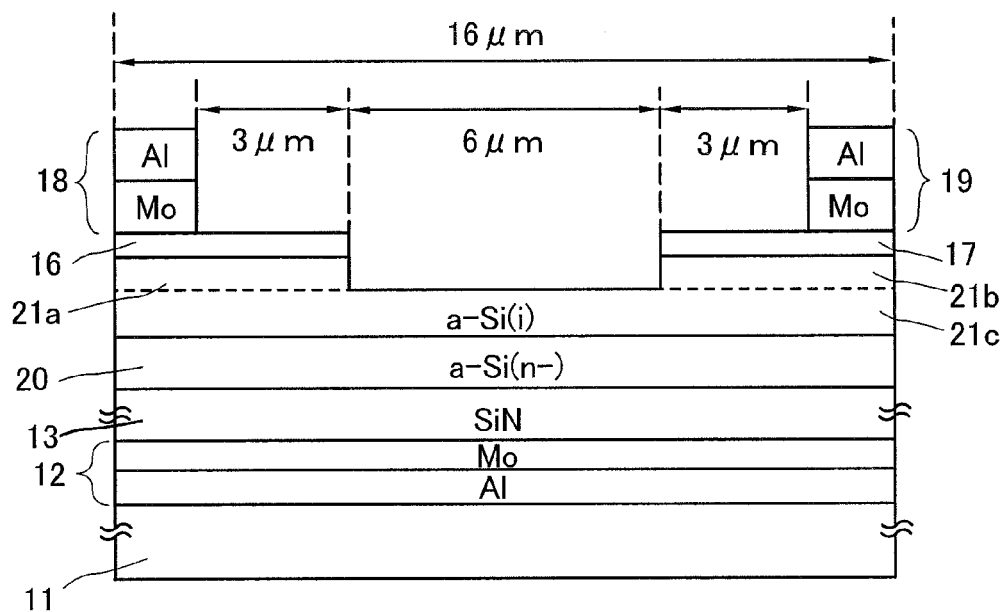
FIG. 6C is a model cross-sectional view.
Figure 7A:
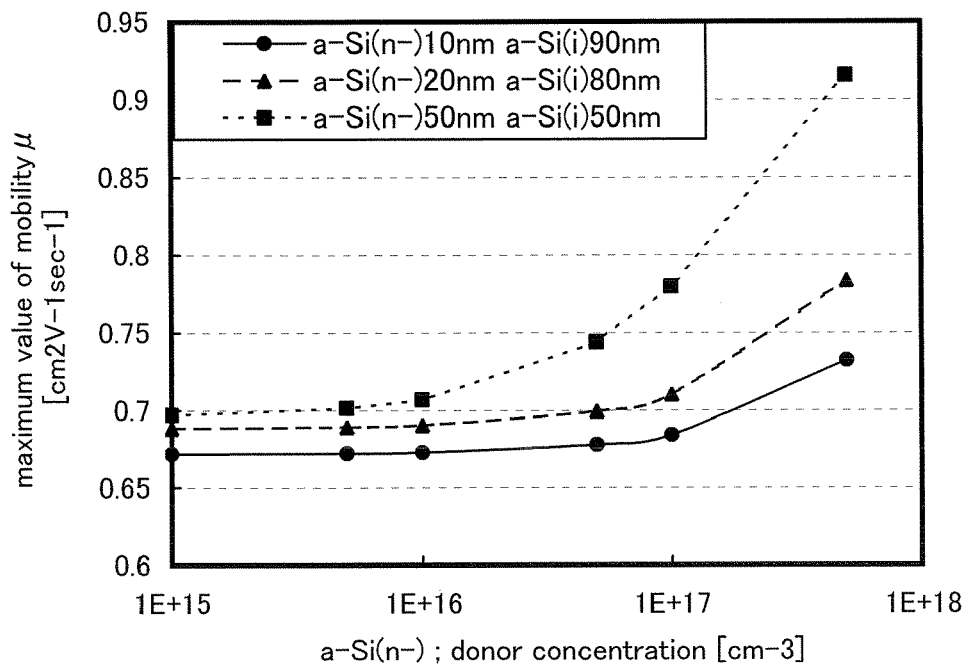
FIGS. 7A and 7B are graphs each showing a relationship between donor concentration and maximum mobility of an n$^-$-type layer.
Figure 7B:
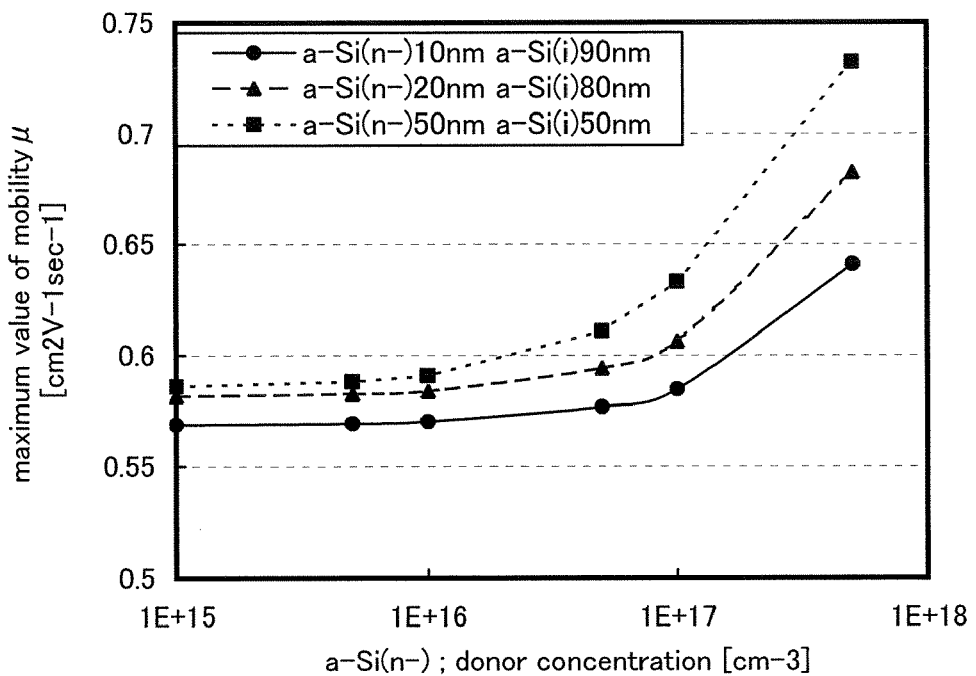

The values of TFT characteristics other than the maximum mobility can also be obtained by calculation with a device simulator by using a model in FIG. 6C.

Figure 22A:
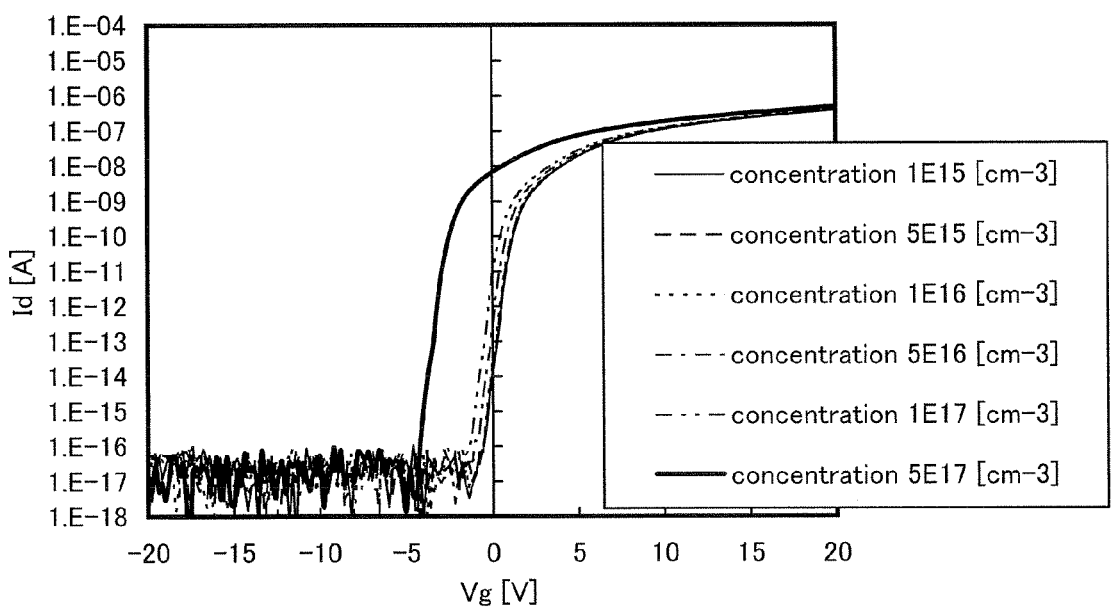
FIGS. 22A and 22B are graphs each showing data on an $I_d$-$V_g$ curve.
Figure 22B:
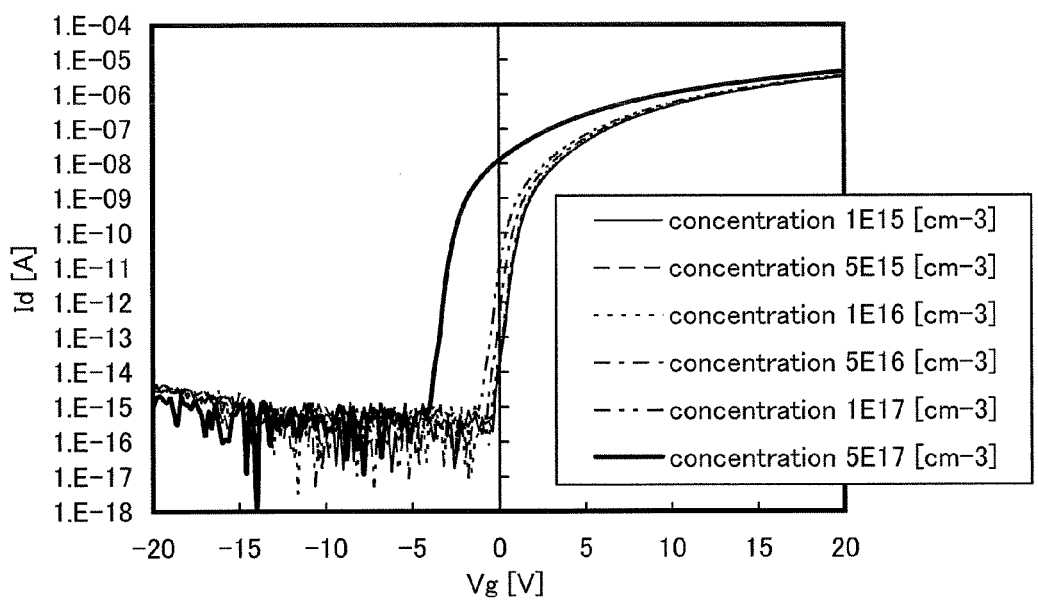

Data on an $I_d$–$V_g$ curve, which is obtained by calculation with the device simulator and consideration thereof are described below. FIG. 22A illustrates data on an $I_d$–$V_g$ curve in the case where $V_d$=1 V under conditions where the film thickness of the n⁻-type layer 20 is 10 nm and the film thickness of the third intrinsic layer 21c is 90 nm. In addition, FIG. 22B illustrates data on an $I_d$–$V_g$ curve in the case where $V_d$=14 V.

Figure 23A:
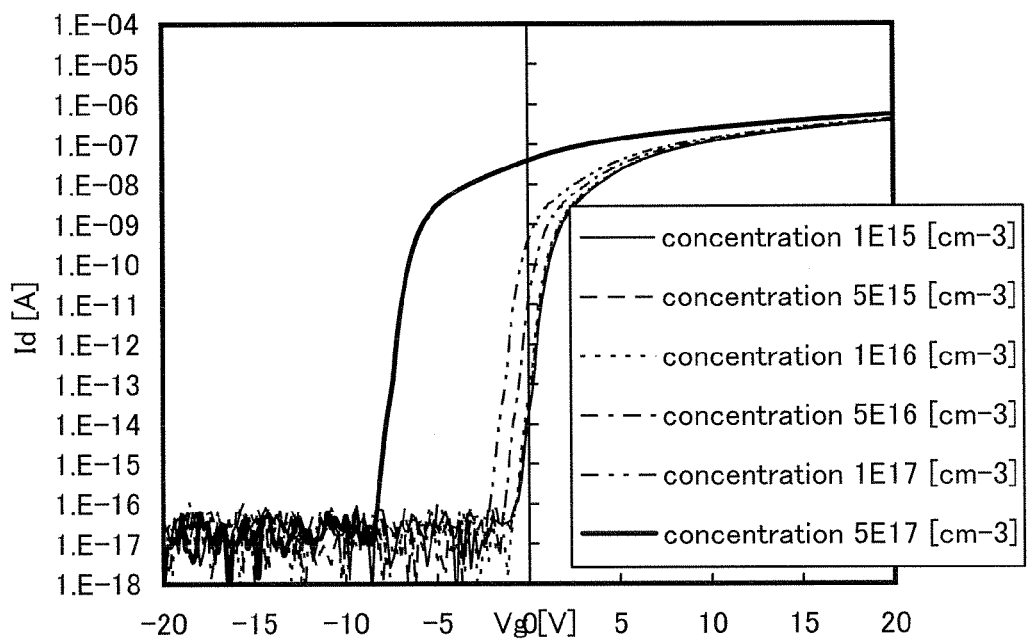
FIGS. 23A and 23B are graphs each showing data on an $I_d$-$V_g$ curve.
Figure 23B:
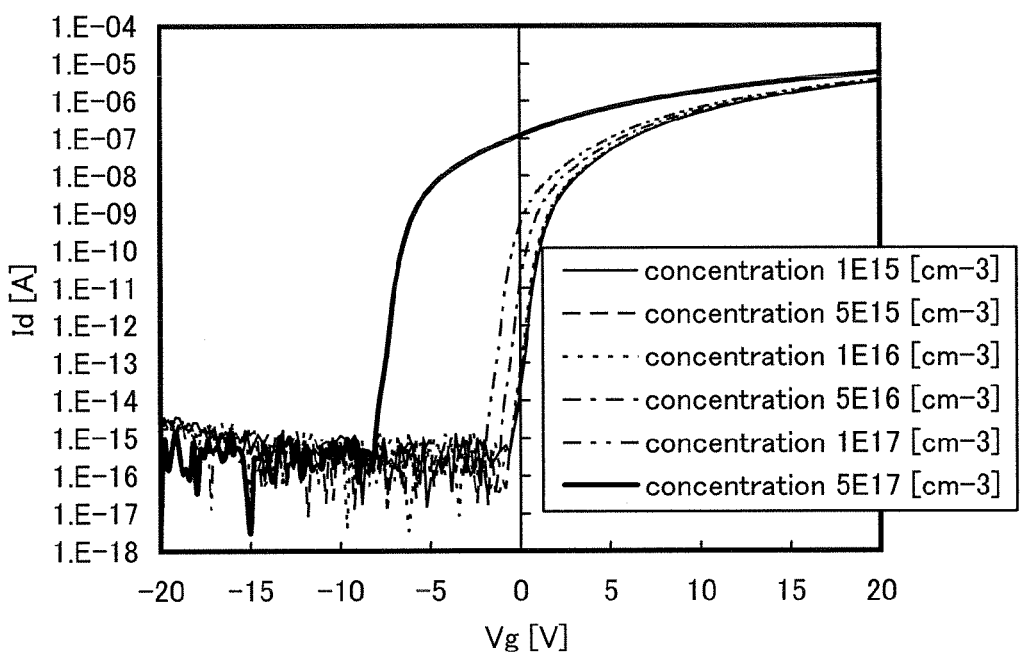

FIG. 23A illustrates data on an $I_d$-$V_g$ curve in the case where $V_d$=1 V under conditions where the film thickness of the n⁻-type layer 20 is 20 nm and the film thickness of the third intrinsic layer 21c is 80 nm. In addition, FIG. 23B illustrates data on an $I_d$-$V_g$ curve in the case where $V_d$=14 V.

Figure 24A:
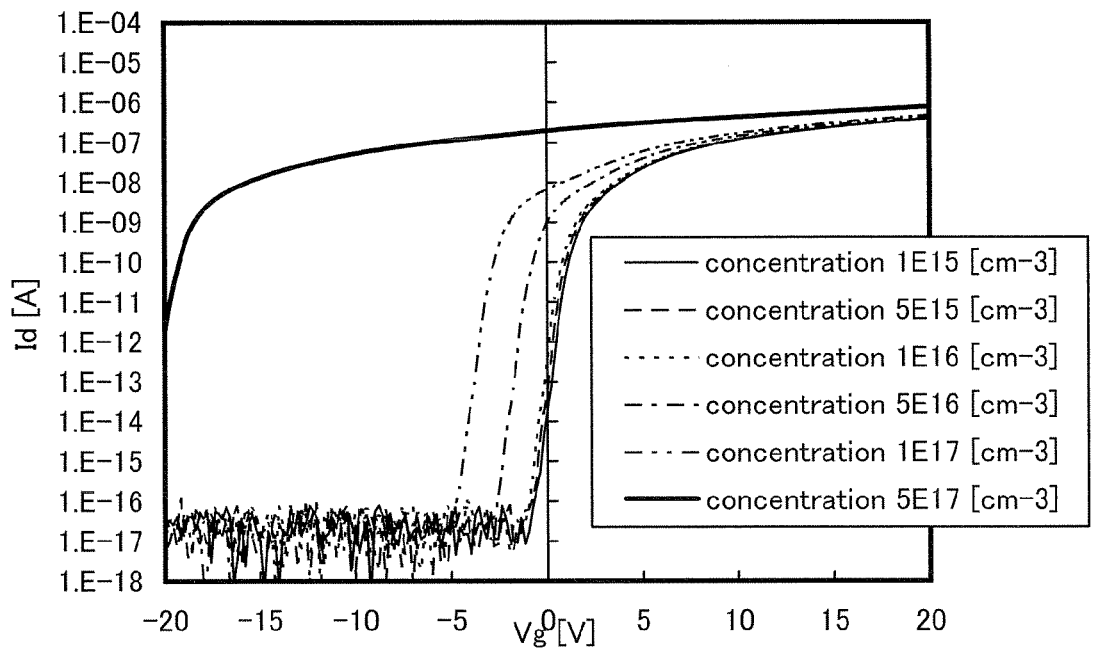
FIGS. 24A and 24B are graphs each showing data on an $I_d$-$V_g$ curve.
Figure 24B:
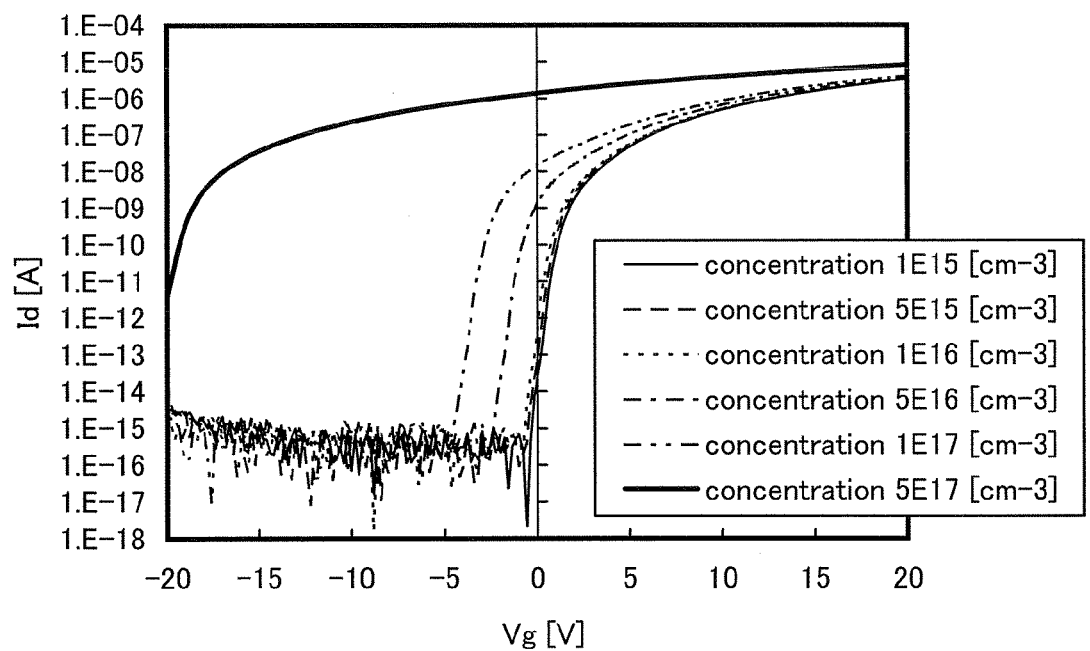

FIG. 24A illustrates data on an $I_d$-$V_g$ curve in the case where $V_d$=1 V under conditions where the film thickness of the n⁻-type layer 20 is 50 nm and the film thickness of the third intrinsic layer 21c is 50 nm. In addition, FIG. 24B illustrates data on an $I_d$-$V_g$ curve in the case where $V_d$=14 V Note that under the conditions where the film thickness of the n⁻-type layer 20 is 50 nm and the film thickness of the third intrinsic layer 21c is 50 nm, the amount of off current is too large in donor concentration 5E17, which is inadequate for a TFT. Therefore, in the case where the film thickness of the n⁻-type layer 20 is 50 nm, it is acceptable as long as the film thickness of the third intrinsic layer 21c is larger than 50 nm though the total thickness is increased.

From the data on the $I_d$-$V_g$ curve, it can be seen that the $I_d$ curve shifts negatively in a $V_g$ axis direction when the donor concentration increases. This threshold voltage shift is caused by change in Fermi energy in the semiconductor layer due to the existence of the n⁻-type layer. In addition, increase of impurity scattering tends to flatten $I_d$ curve in the $V_g$ axis direction. Impurity scattering is a phenomenon where conduction electrons are scattered by impurity elements which are added to the semiconductor layer and does not depend on whether the added impurities belong to Group 3 or Group 5. Impurity scattering depends on increase in impurity level in an energy gap by adding impurity elements. Therefore, this is equal to bad crystallinity of the semiconductor layer and leads to decrease in drain current. Further, by increasing the film thickness of the n⁻-type layer, the amount of negative shift of the $I_d$ curve in the $V_g$ axis direction increases. This is because the total amount of donors is increased and the value of donor level is increased, so that the Fermi energy becomes closer to conduction band energy EC. That is, the reason for this is that an inversion layer can be formed at a lower gate potential.

Further, data on on current, which is obtained by calculation with the device simulator and consideration thereof are described below.

Figure 25A:
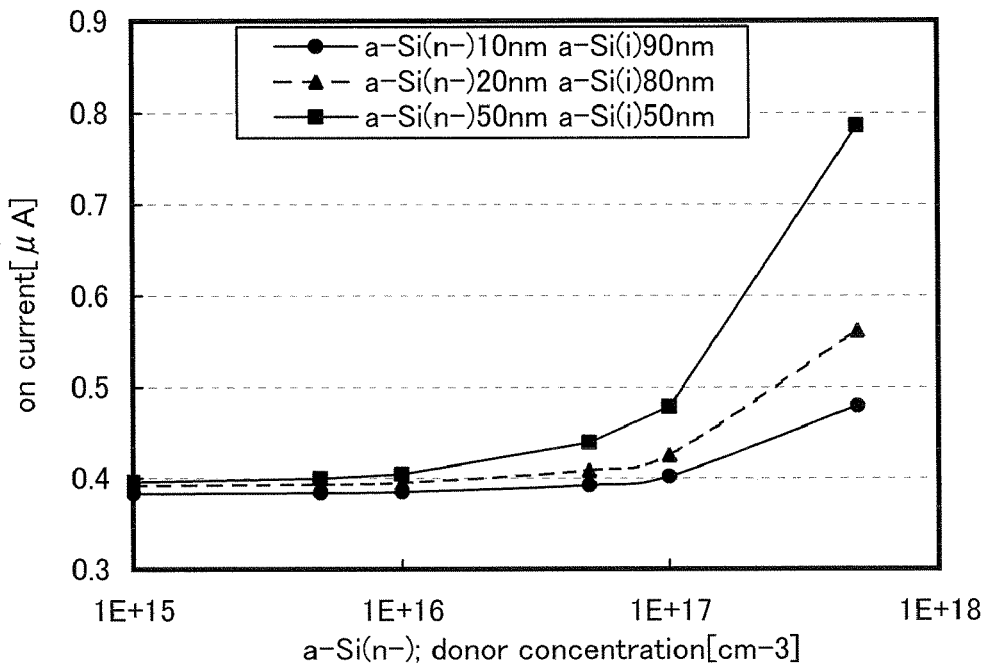
FIGS. 25A and 25B are graphs each showing a relationship between donor concentration and on current of an n$^-$-type layer.
Figure 25B:
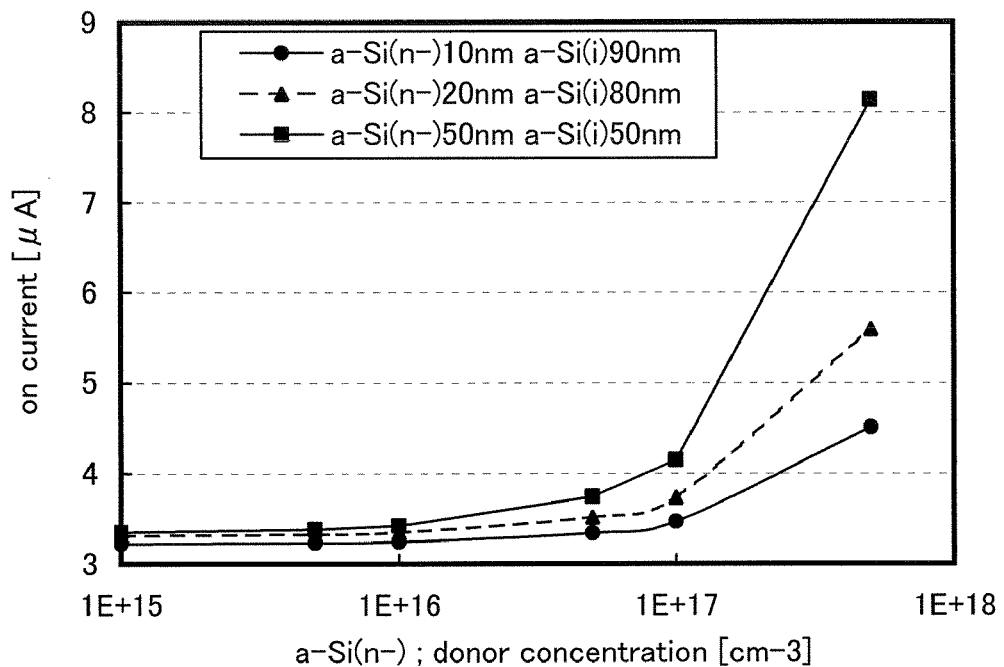

FIG. 25A is a graph illustrating a relationship between donor concentration and on current of the n⁻-type layer in the case where drain voltage is low ($V_d$=1 V). Further, FIG. 25B is a graph illustrating a relationship between donor concentration and on current of the n⁻-type layer in the case where drain voltage is high ($V_d$=14 V).

In an on state, drain current is a function which is increased monotonously with respect to gate voltage $V_g$. This is because as the gate voltage $V_g$ increases, the number of conduction electrons of the semiconductor layer, which are induced to the interface of a gate insulating film, increases. Therefore, by increasing the donor concentration, on current (drain current when gate voltage $V_g$=20 V) increases by taking the negative shift of the $I_d$ curve in the $V_g$ axis direction into consideration. Note that by taking impurity scattering into consideration, contribution of increase in the number of conduction electrons is large though drain current is decreased. Accordingly, drain current is increased. Further, by increasing the film thickness of the n-type layer, the semiconductor layer which contributes to conduction increases. Therefore, on current is increased.

Further, data on the threshold voltage, which is obtained by calculation with the device simulator and consideration thereof are described below.

Figure 26A:
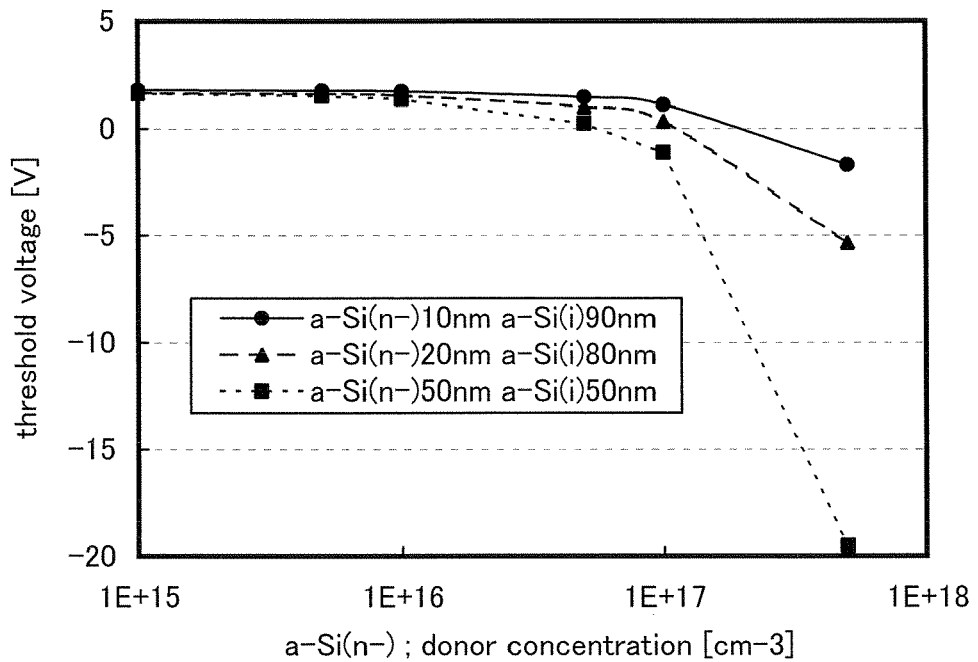
FIGS. 26A and 26B are graphs each showing a relationship between donor concentration and threshold voltage of an n$^-$-type layer.
Figure 26B:
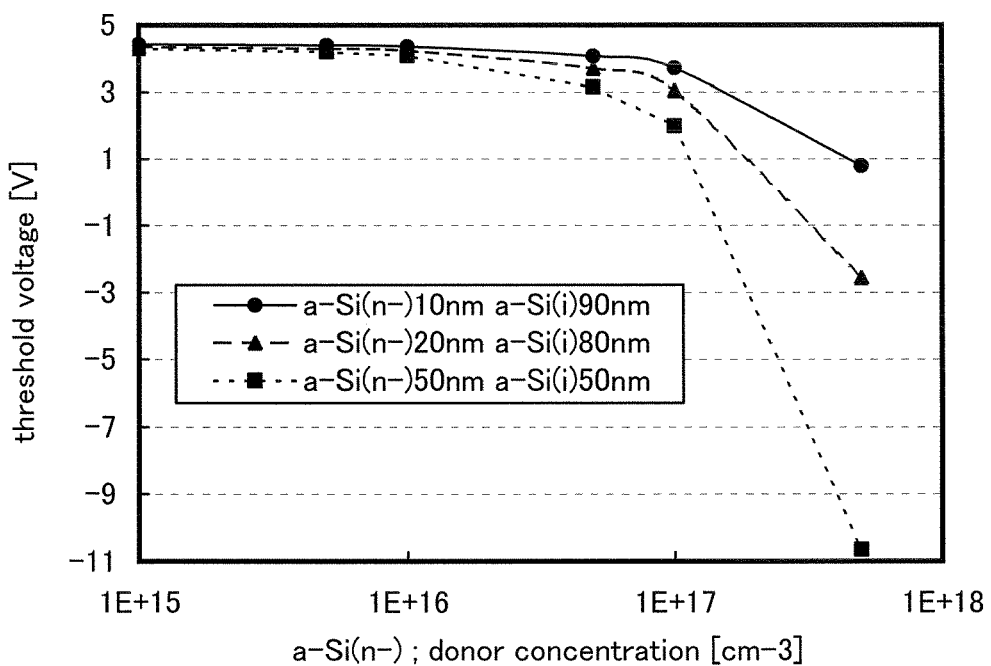

FIG. 26A is a graph illustrating a relationship between donor concentration and the threshold voltage of the n⁻-type layer in the case where drain voltage is low ($V_d$=1 V). Further, FIG. 26B is a graph illustrating a relationship between donor concentration and the threshold voltage of the n⁻-type layer in the case where drain voltage is high ($V_d$=14 V). By increasing the donor concentration, the threshold voltage shifts negatively. Moreover, by increasing the film thickness of the n⁻-type layer, the amount of negative shift of the threshold voltage is increased.

Further, data on subthreshold swing, which is obtained by calculation with the device simulator and consideration thereof are described below.

Figure 27A:
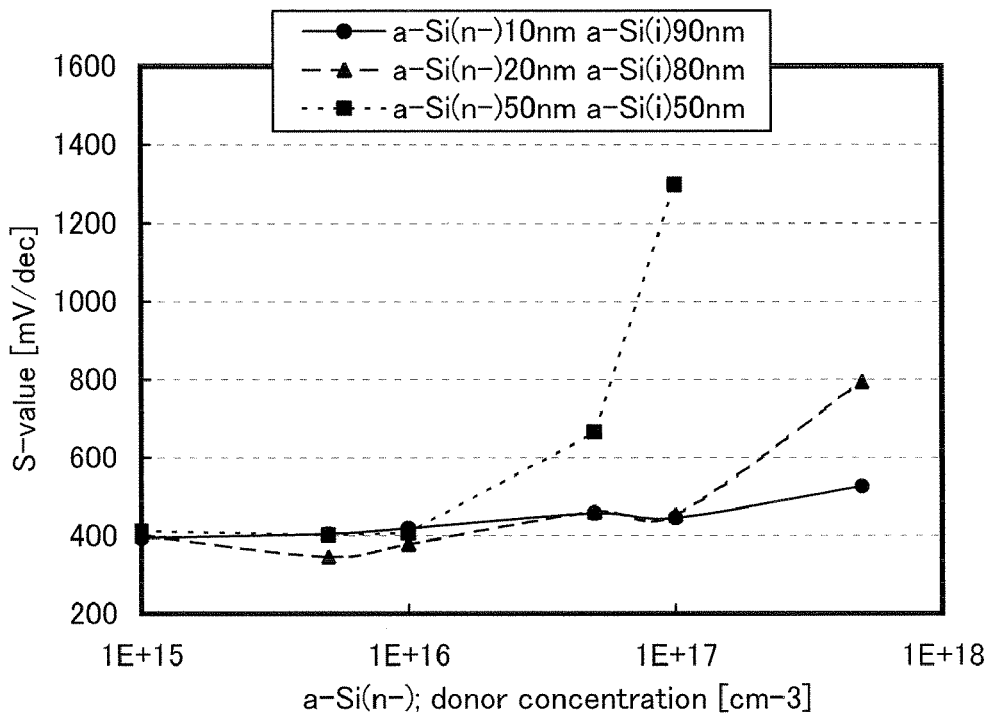
FIGS. 27A and 27B are graphs each showing a relationship between donor concentration and subthreshold swing of an n$^-$-type layer.
Figure 27B:
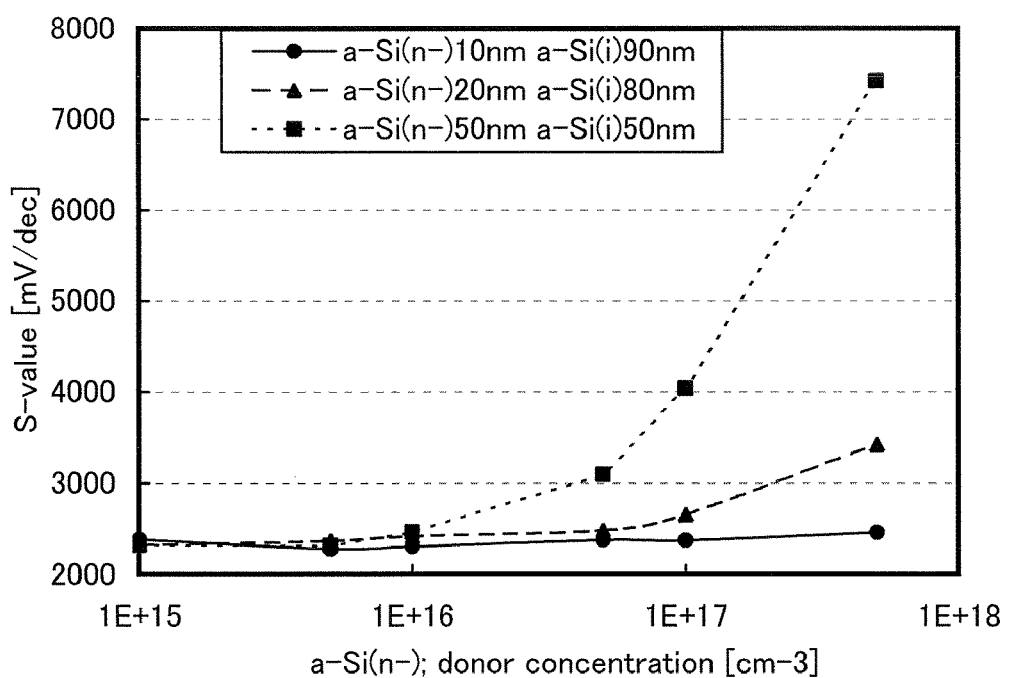

FIG. 27A is a graph illustrating a relationship between donor concentration and the subthreshold swing of the n⁻-type layer in the case where drain voltage is low ($V_d$=1 V). Further, FIG. 27B is a graph illustrating a relationship between donor concentration and the subthreshold swing of the n⁻-type layer in the case where drain voltage is high ($V_d$=14 V). By increasing the donor concentration, impurity scattering is increased, so that the subthreshold swing is increased. By increasing the film thickness of the n⁻-type layer, the subthreshold swing is also increased. This is because the total amount of impurities is increased and the value of donor level is increased, so that conduction electrons are more easily scattered.

This application is based on Japanese Patent Application serial no. 2007-262603 filed with Japan Patent Office on Oct. 5, 2007, the entire contents of which are hereby incorporated by reference.

What is claimed is:

1. A method for manufacturing a semiconductor device, comprising the steps of:
    forming a gate electrode over a substrate having an insulating surface;
    forming a first insulating layer containing phosphorus over the gate electrode;
    exposing a surface of the first insulating layer to an atmosphere containing a phosphine gas;
    forming an n-type amorphous semiconductor layer over the first insulating layer;
    forming an amorphous semiconductor layer having larger film thickness than the n-type amorphous semiconductor layer over the n-type amorphous semiconductor layer;
    forming an n-type semiconductor layer containing phosphorus at higher concentration than the n-type amorphous semiconductor layer over the amorphous semiconductor layer;
    forming a source electrode and a drain electrode over the n-type semiconductor layer,
    forming a depressed portion in the amorphous semiconductor layer, and
    forming a second insulating layer over the depressed portion, and
    wherein the n-type semiconductor layer extends beyond edges of the source and drain electrodes.

2. The method for manufacturing a semiconductor device, according to claim 1, wherein the atmosphere containing phosphine gas contains a silane gas and hydrogen.

3. The method for manufacturing a semiconductor device, according to claim 1, wherein the amorphous semiconductor layer is formed using amorphous silicon containing hydrogen.

4. A method for manufacturing a semiconductor device, comprising the steps of:
    forming a gate electrode over a substrate having an insulating surface;

forming a first insulating layer containing phosphorus over the gate electrode;

forming an n-type amorphous semiconductor layer over the first insulating layer containing phosphorus;

forming an amorphous semiconductor layer having larger film thickness than the n-type amorphous semiconductor layer over the n-type amorphous semiconductor layer;

forming an n-type semiconductor layer containing phosphorus at higher concentration than the n-type amorphous semiconductor layer over the amorphous semiconductor layer; and forming a source electrode and a drain electrode over the n-type semiconductor layer, forming a depressed portion in the amorphous semiconductor layer, and forming a second insulating layer over the depressed portion, and wherein the n-type semiconductor layer extends beyond edges of the source and drain electrodes.

5. The method for manufacturing a semiconductor device, according to claim 4, wherein the amorphous semiconductor layer is formed using amorphous silicon containing hydrogen.

6. A semiconductor device comprising:

a gate electrode over a substrate having an insulating surface;

a first insulating layer containing phosphorus over the gate electrode;

an n-type amorphous semiconductor layer over the first insulating layer;

an amorphous semiconductor layer having larger film thickness than the n-type amorphous semiconductor layer over the n-type amorphous semiconductor layer;

an n-type semiconductor layer containing phosphorus at higher concentration than the n-type amorphous semiconductor layer over the amorphous semiconductor layer;

a source electrode and a drain electrode over the n-type semiconductor layer, forming a depressed portion in the amorphous semiconductor layer, and forming a second insulating layer over the depressed portion, wherein in the n-type amorphous semiconductor layer, concentration of each of nitrogen and oxygen is lower than ten times concentration of phosphorus contained in the n-type amorphous semiconductor layer; and wherein concentration of boron is lower than one-tenth the concentration of phosphorus contained in the n-type amorphous semiconductor layer.

7. The semiconductor device according to claim 6, wherein in the n-type amorphous semiconductor layer, concentration of each of nitrogen and oxygen is lower than or equal to $5 \times 10^{18}$ cm$^{-3}$ and concentration of phosphorus is higher than or equal to $6 \times 10^{15}$ cm$^{-3}$ and lower than or equal to $3 \times 10^{18}$ cm$^{-3}$.

8. The semiconductor device according to claim 6, wherein a concentration peak of phosphorus is located around an interface between the first insulating layer and the n-type amorphous semiconductor layer.

9. The semiconductor device according to claim 6, wherein concentration of carbon in the n-type amorphous semiconductor layer is lower than or equal to $5 \times 10^{18}$ cm$^{-3}$.

10. The semiconductor device according to claim 6, wherein the amorphous semiconductor layer is formed using amorphous silicon containing hydrogen.

11. The semiconductor device according to claim 6, wherein the first insulating film is a silicon nitride film.

12. The semiconductor device according to claim 6, wherein the n-type semiconductor layer extends beyond edges of the source and drain electrodes.

13. The semiconductor device according to claim 1, wherein the n-type amorphous semiconductor layer has a concentration gradient of phosphorus, which becomes higher closer to the first insulating layer.

14. The semiconductor device according to claim 4, wherein the n-type amorphous semiconductor layer has a concentration gradient of phosphorus, which becomes higher closer to the first insulating layer.

15. The semiconductor device according to claim 6, wherein the n-type amorphous semiconductor layer has a concentration gradient of phosphorus, which becomes higher closer to the first insulating layer.

16. The semiconductor device according to claim 1, wherein the second insulating layer is on and in contact with a top surface of the n-type semiconductor layer.

17. The semiconductor device according to claim 4, wherein the second insulating layer is on and in contact with a top surface of the n-type semiconductor layer.

18. The semiconductor device according to claim 6, wherein the second insulating layer is on and in contact with a top surface of the n-type semiconductor layer.

* * * * *